(12) United States Patent
Huang

(10) Patent No.: US 8,815,653 B2
(45) Date of Patent: Aug. 26, 2014

(54) PACKAGING AND CONNECTING ELECTROSTATIC TRANSDUCER ARRAYS

(75) Inventor: Yongli Huang, San Jose, CA (US)

(73) Assignee: Kolo Technologies, Inc., San Jose, CA (US)

( * ) Notice: Subject to any disclaimer, the term of this patent is extended or adjusted under 35 U.S.C. 154(b) by 0 days.

(21) Appl. No.: 12/745,731

(22) PCT Filed: Dec. 3, 2008

(86) PCT No.: PCT/US2008/085352
§ 371 (c)(1),
(2), (4) Date: Jun. 2, 2010

(87) PCT Pub. No.: WO2009/073692
PCT Pub. Date: Jun. 11, 2009

(65) Prior Publication Data
US 2010/0255623 A1    Oct. 7, 2010

Related U.S. Application Data

(60) Provisional application No. 61/024,843, filed on Jan. 30, 2008, provisional application No. 60/992,052, filed on Dec. 3, 2007.

(51) Int. Cl.
*H01L 21/82* (2006.01)
*H01L 25/04* (2014.01)
*H01L 25/07* (2006.01)

(52) U.S. Cl.
CPC ............. *H01L 25/042* (2013.01); *H01L 25/072* (2013.01)
USPC ........... 438/128; 438/108; 438/109; 257/723; 257/724; 257/778; 257/686; 257/528

(58) Field of Classification Search
CPC . H01L 25/042; H01L 25/047; H01L 25/0652; H01L 25/071; H01L 25/072; H01L 25/0753
USPC ......... 438/106, 107, 108, 109, 110, 111, 112, 438/113, 114, 125, 126, 127, 128, 129, 121, 438/124, 612, FOR. 485, 456, 458, 977, 438/462, 460, 123, 455, 459; 257/723, 724, 257/725, 726, 734, 777, 778, 678, 684, 690, 257/528, 532, 776, 779, 780, 781, 782, 783, 257/784, 785, 786, 787, 774, 686, 529; 361/760, 761, 762, 763, 764, 767, 803
See application file for complete search history.

(56) References Cited

U.S. PATENT DOCUMENTS 5,353,498 A * 10/1994 Fillion et al. ................... 29/840
5,841,193 A * 11/1998 Eichelberger ................ 257/723
(Continued)

FOREIGN PATENT DOCUMENTS

EP        1810619 A1    7/2007
JP       2004004342     1/2004
(Continued)

OTHER PUBLICATIONS

Translated Chinese Office Action mailed Oct. 25, 2011 for Chinese patent application No. 200880118644.3, a counterpart foreign application of U.S. Appl. No. 12/745,727, 10 pages.

(Continued)

*Primary Examiner* — Thanh Y Tran
(74) *Attorney, Agent, or Firm* — Lee & Hayes, PLLC

(57) ABSTRACT

Embodiments of a method for packaging cMUT arrays allow packaging multiple cMUT arrays on the same packaging substrate introduced over a side of the cMUT arrays. The packaging substrate is a dielectric layer on which openings are patterned for depositing a conductive layer to connect a cMUT array to VO pads interfacing with external devices. Auxiliary system components may be packaged together with the cMUT arrays. Multiple cMUT arrays and optionally multiple auxiliary system components can be held in place by a larger support structure for batch production. The support structure can be made of an arbitrary size using inexpensive materials.

37 Claims, 20 Drawing Sheets

(56) References Cited

U.S. PATENT DOCUMENTS

| | | | |
|---|---|---|---|
| 6,472,290 | B2 | 10/2002 | Cho et al. |
| 7,049,051 | B2 | 5/2006 | Gabriel et al. |
| 7,134,942 | B2 | 11/2006 | Nagai et al. |
| 7,473,866 | B2 | 1/2009 | Morishige et al. |
| 7,544,588 | B2 | 6/2009 | Genda |
| 2004/0256734 | A1* | 12/2004 | Farnworth et al. ............ 257/777 |
| 2005/0146240 | A1 | 7/2005 | Smith et al. |
| 2005/0177045 | A1 | 8/2005 | Degertekin et al. |
| 2006/0075818 | A1 | 4/2006 | Huang et al. |
| 2007/0013269 | A1 | 1/2007 | Huang |
| 2007/0180916 | A1 | 8/2007 | Tian et al. |
| 2007/0273013 | A1 | 11/2007 | Kohl et al. |

FOREIGN PATENT DOCUMENTS

| | | |
|---|---|---|
| JP | 2006122188 | 5/2006 |
| JP | 2007122188 | 5/2007 |
| JP | 2007124613 | 5/2007 |
| WO | WO2007107736 A2 | 9/2007 |

OTHER PUBLICATIONS

Non-Final Office Action for U.S. Appl. No. 12/745,727, mailed on Jul. 11, 2012, Yongli Huang, "Through-Wafer Interconnections in Electrostatic Transducer and Array", 9 pages.

Translated Chinese Office Action mailed Apr. 6, 2012 for Chinese patent application No. 200880118678.2, a counterpart foreign application of U.S. Appl. No. 12/745,731, 13 pages.

Translated Chinese Office Action mailed Dec. 28, 2012 for Chinese patent application No. 200880118678.2, a counterpart foreign application of U.S. Appl. No. 12/745,731, 11 pages.

Translated Japanese Office Action mailed Dec. 7, 2012 for Japanese patent application No. 2010-536237, a counterpart foreign application of U.S. Appl. No. 12/745,727, 5 pages.

Final Office Action for U.S. Appl. No. 12/745,731, mailed on Nov. 9, 2012, Yongli Huang, "Packaging and Connecting Electrostatic Transducer Arrays", 17 pages.

Translated Japanese Office Action mailed Nov. 26, 2013 for Japanese patent application No. 2010-536236, a counterpart foreign application of U.S. Appl. No. 12/745,731, 11 pages.

Translated Chinese Office Action mailed Jul. 9, 2013 for Chinese patent application No. 200880118678.2, a counterpart foreign application of U.S. Appl. No. 12/745,731, 8 pages.

Translated Chinese Office Action mailed Jan. 26, 2014 for Chinese patent application No. 200880118678.2, a counterpart foreign application of U.S. Appl. No. 12/745,731, 8 pages.

* cited by examiner

PACKAGING AND CONNECTING ELECTROSTATIC TRANSDUCER ARRAYS

RELATED APPLICATIONS

This application claims priority benefits of U.S. Provisional Patent Application No. 60/992,052, entitled "PACKAGING AND CONNECTING ELECTROSTATIC TRANSDUCER ARRAYS", filed on Dec. 3, 2007; and U.S. Provisional Patent Application No. 61/024,843 entitled "PACKAGING AND CONNECTING ELECTROSTATIC TRANSDUCER ARRAYS", filed on Jan. 30, 2008, which patent applications are hereby incorporated by reference in their entirety.

This application is further related to International (PCT) Patent Application No. PCT/US2008/085447, filed Dec. 3, 2008, entitled "CMUT PACKAGING FOR ULTRASOUND SYSTEM"; and International (PCT) Patent Application No. PCT/US/2008/085374, filed Dec. 3, 2008, entitled "THROUGH-WAFER INTERCONNECTIONS IN ELECTROSTATIC TRANSDUCER AND ARRAY"; both applications filed on even date with the present application, and are hereby incorporated by reference in their entirety.

BACKGROUND

The present disclosure relates to packaging and making interconnections of transducer arrays, particularly to packaging and interconnections of capacitive micromachined ultrasonic transducer (cMUT) arrays.

The packaging or making interconnections of a transducer array on a proper substrate is a key for any application using a transducer array, especially for a transducer array with large number of elements. One of exemplary applications is ultrasound imaging which uses an ultrasound transducer arrays. The proper packaging and interconnections of the ultrasound transducer array is very important to achieve desired performance with lower cost.

Capacitive micromachined ultrasonic transducers (cMUTs) are electrostatic actuators/transducers, which are widely used in various applications. Ultrasonic transducers can operate in a variety of media including liquids, solids and gas. Ultrasonic transducers are commonly used for medical imaging for diagnostics and therapy, biochemical imaging, non-destructive evaluation of materials, sonar, communication, proximity sensors, gas flow measurements, in-situ process monitoring, acoustic microscopy, underwater sensing and imaging, and numerous other practical applications. A typical structure of a cMUT is a parallel plate capacitor with a rigid bottom electrode and a movable top electrode residing on or within a flexible membrane, which is used to transmit/accurate (TX) or receive/detect (RX) an acoustic wave in an adjacent medium. A direct current (DC) bias voltage may be applied between the electrodes to deflect the membrane to an optimum position for cMUT operation, usually with the goal of maximizing sensitivity and bandwidth. During transmission an alternating current (AC) signal is applied to the transducer. The alternating electrostatic force between the top electrode and the bottom electrode actuates the membrane in order to deliver acoustic energy into the medium surrounding the cMUT. During reception an impinging acoustic wave causes the membrane to vibrate, thus altering the capacitance between the two electrodes.

For actual application, a cMUT array needs to be packaged on a print circuit board (PCB) or a substrate with desired circuits (electrical wires, pads or other electrical components) to interface with outside. Usually a cMUT array is diced from its fabrication process wafer (substrate) and attached on a PCB. A wire-bonding, flip-chip bonding or other standard IC packaging methods is then used to electrically connect the cMUT array with the wires, pads or the circuits on a PCB. In the existing packaging techniques, a PCB or a packaging substrate of the cMUT transducer is manufactured separately and the finished packaging substrate (e.g., a PCB) and the finished cMUT are attached together by a glue layer such as epoxy.

Many techniques have been developed in semiconductor industry to make interconnections between a device chip and a PCB. Two typical methods are wire-bonding and flip-chip bonding. Using the standard semiconductor packaging methods, the conventional cMUT packaging methods first make a PCB or a packaging substrate with a desired design, then assemble all components (e.g., cMUT transducers, IC chips, inductors, switches) on the PCB board, and finally make the connections between the components using either wire bonding, soldering or flip-chip bonding method. The electrical connection is done either by single wire connection each time or one chip/component each time, and is thus time-consuming for a system with a large number of components and an array with a large number of elements. In addition, the device insulation using thin film dielectric material coating is difficult to achieve using these conventional packaging methods. Furthermore, both flip-chip bonding and wire bonding need a large footprint which occupy a lot of area. Therefore, a better packaging and connection method is needed.

SUMMARY

Disclosed is a method for packaging cMUT arrays that allows packaging multiple cMUT arrays with optional system components on the same substrate introduced over a side of the cMUT arrays. The substrate is a dielectric layer on which openings are patterned for depositing a conductive layer to connect a cMUT array to I/O pads interfacing with external devices. Multiple cMUT arrays can be held in place by a larger support structure for batch production. The support structure can be made of an arbitrary size using inexpensive materials.

According to one aspect of the disclosure, the method first provides a cMUT array, introduces a first dielectric packaging substrate layer over a first side of the cMUT array, and forms a first pattern in the first dielectric packaging substrate layer. The first pattern has a first opening over the cMUT array. After that, the method introduces a first conductive layer patterned over the first packaging substrate layer to connect to the cMUT array through the first opening. The first conductive layer has a first connection line between an I/O pad and the first opening over the cMUT array.

Multiple cMUT arrays can be arranged in the same batch and simultaneously processed using the same method. The first side of the cMUT array may either be a top side over a cMUT fabrication substrate on which the cMUT array is fabricated, or the bottom side of the cMUT fabrication substrate. In case of the bottom side, the first opening may connect to a through-wafer interconnection member of the cMUT array. Typically, each cMUT array includes multiple cMUT elements. Connections can be made to connect each element in a cMUT array.

In one embodiment, first dielectric packaging substrate layer a flexible, making the packaging method particularly suitable for applications where the cMUT a device may need to be folded or wrapped around a device support.

In one embodiment, the method provides a packaging support structure having a cMUT array holder, and attaches the cMUT array to the cMUT array holder for further packaging. The cMUT array holder may be embodied in a variety of ways, such as a cavity formed in the packaging support structure, or a surface area adapted for fastening the cMUT array thereupon. The cavity may have a retaining member for securing the cMUT array when placed in the cavity.

Two or more layers of dielectric packaging substrate and conductive layers may be used for most sophisticated packaging. An auxiliary system component may be provided and packaged with the cMUT array side by side. The auxiliary system component may contain variety of electronic devices.

Another aspect of the disclosure is a method for fabricating thin cMUT arrays that are particularly suitable for packaging using the disclosed packaging method. The method provides a cMUT fabrication substrate, and forms an opening pattern from a top side of the cMUT fabrication substrate to define a boundary of a cMUT array. The trench reaches only a partial depth the cMUT fabrication substrate. The method then forms the cMUT array on the top side of the cMUT fabrication substrate, and removes a bottom portion of the cMUT fabrication substrate from a bottom side so that a remaining portion of the cMUT fabrication substrate forms a separate bottom electrode for the first cMUT array. The opening pattern may also define boundaries of individual cMUT elements in the cMUT array to form separate bottom electrode for each cMUT element. The method may also be used for completely separating individual cMUT arrays from the rest of the cMUT separate substrate. The bottom portion of the cMUT fabrication substrate may be removed in a variety of ways, such as thinning the cMUT fabrication substrate from the bottom side to reach the trench's deepest end, or using an SOI wafer and removing the handle layer of the SOI wafer.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE FIGURES

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Disclosed are new methods of packaging and interconnections for electrostatic transducer arrays, especially for cMUT arrays. The disclosed methods are particularly suitable for packaging multiple transducers at the same time in a batch fabrication process. The transducer(s) may be packaged with additional circuits.

In this description, a dielectric material is a non-conducting substance, i.e. an insulator. Examples of a dielectric material that are suitable for the present disclosure include, but not limited to, PDMS, Parylene, nitride film, oxide film, Riston, Kapton, photoresist, other polymer, and polyimide.

A substrate used to fabricate the transducer (e.g., a cMUT array) using MEMS or semiconductor fabrication process is refers to as the fabrication substrate. The fabrication substrate usually is a silicon wafer or a glass wafer.

A substrate which is used to package or assemble the transducers with desired metal patterns or other electrical components is referred to as a packaging substrate.

A structure which is used in addition to the packaging substrate to hold separate transducers and other electrical components in place during the packaging is referred to as a support structure.

In this description, an exemplary 1-D transducer array is often chosen to demonstrate the different packaging methods. However, it is appreciated that the same methods can be used for 2-D array, 1.5-D array, ring shape array or any other types of arrays.

Figure 1:
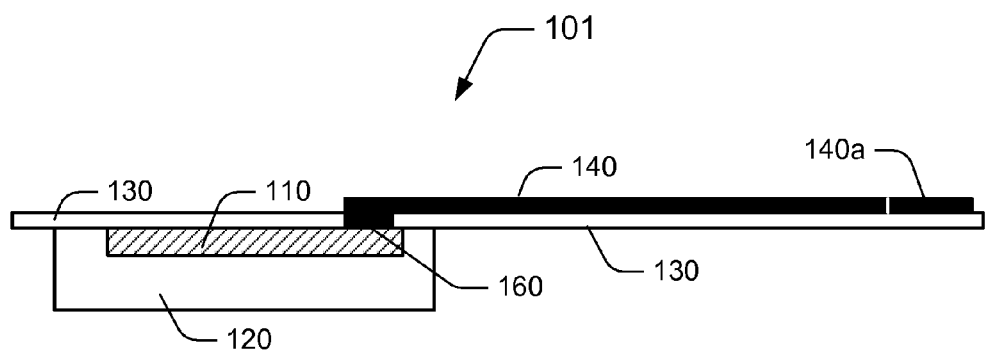
FIG. 1 illustrates a cross-section view of a first exemplary transducer packaged using the disclosed packaging methods.
Figure 3:
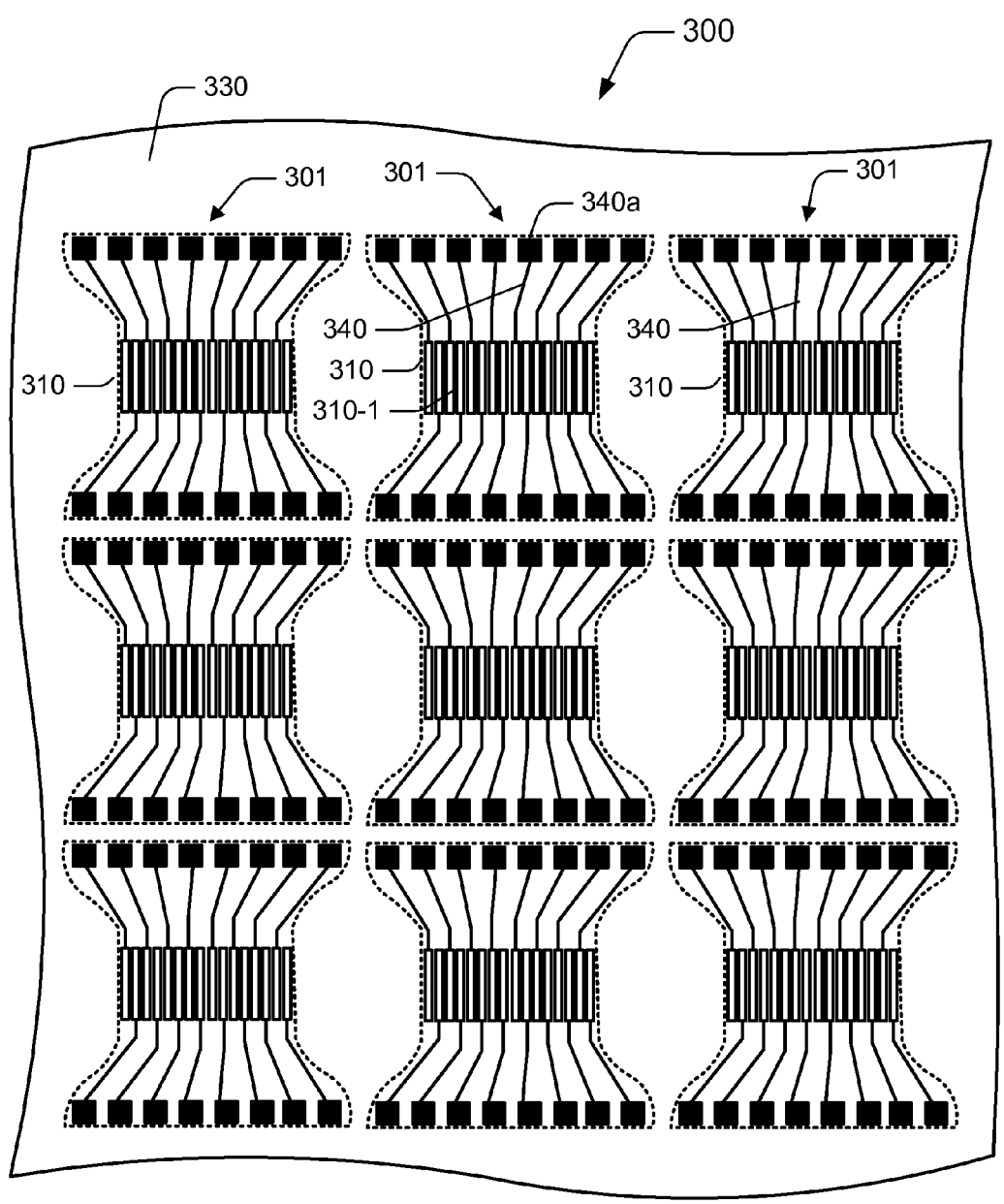
FIG. 3 illustrates a top view of multiple 1-D cMUT transducers packaged on a packaging substrate in a batch fabrication process.
Figure 4:
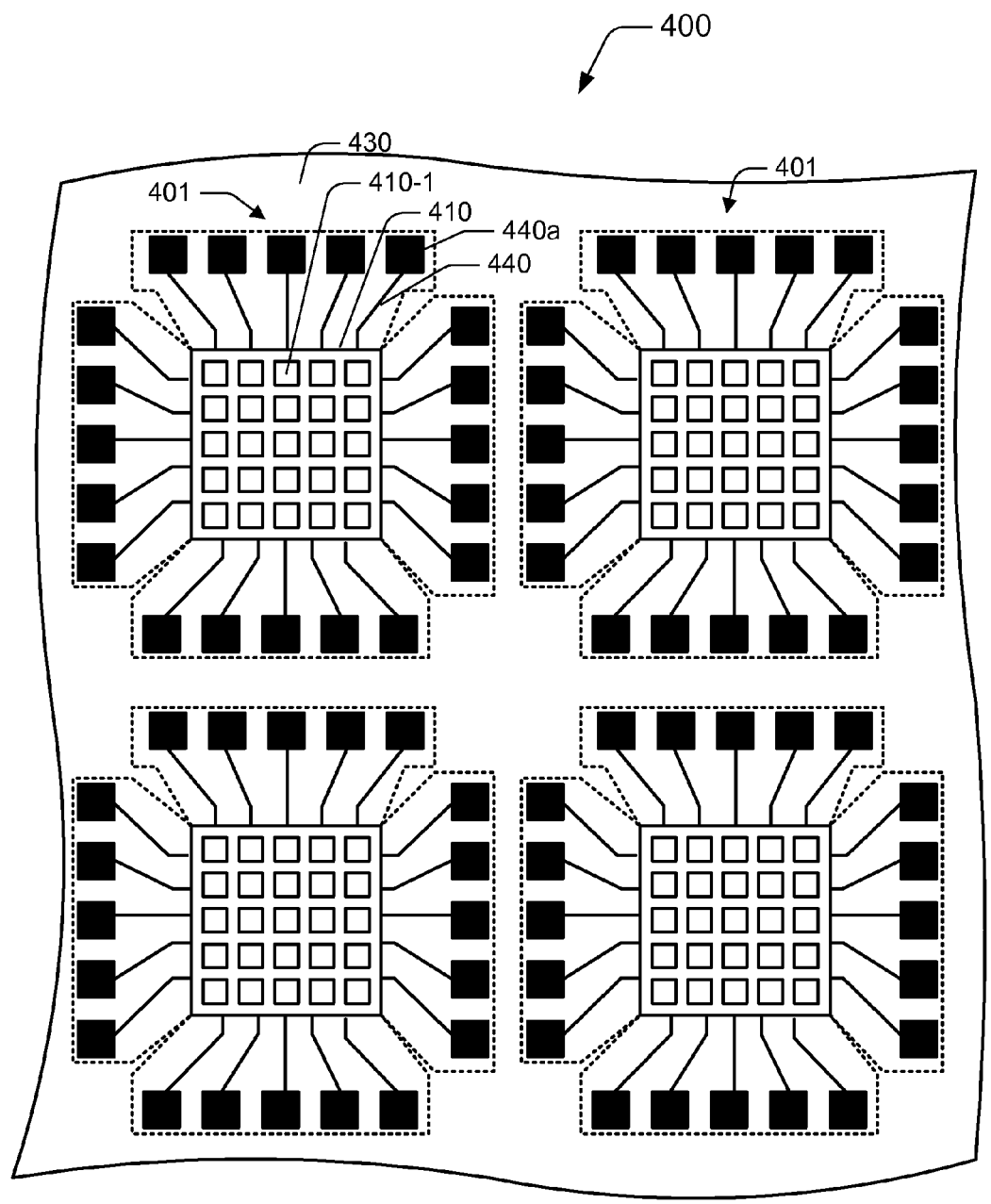
FIG. 4 illustrates a top view of multiple 2-D cMUT transducers packaged on a packaging substrate in a batch fabrication process.

FIG. 1 illustrates a cross-section view of a first exemplary transducer packaged using the disclosed packaging methods. Only one packaged transducer 101 is shown in the figure, but a packaging assembly can have multiple transducers 101 packaged in the same batch process on the same packing substrate 130, as shown in FIGS. 3-4. FIG. 1 is used to illustrate the packaging process that is used to produce the packaged transducer 101. A cMUT array 110 is first fabricated on a front side (or top side) of the fabrication substrate 120. Then a dielectric material layer (130) is introduced on the transducer array 110 to form a packaging substrate 130. Any suitable method may be used to form or introduce the packaging substrate 130. Exemplary methods include spinning coating, depositing, bonding and lamination. An opening 160 is formed on the packaging substrate 130 over the cMUT array 110 to provide conductive access to the conductive part such as an electrode of the cMUT array 110. The opening 160 may be part of an overall pattern formed in the packaging substrate 130.

A conductive layer 140 is patterned over the packaging substrate layer 130 to provide at least part of an interconnection for connecting the cMUT array 110 to the outside through the opening 160. The conductive layer 140 can be a metal or polysilicon layer formed on the dielectric layer 130 using a suitable method such as depositing, sputtering, electroplating, and electroforming. The conductive layer 140 forms electrical connections to connect to the cMUT array 110 to through the opening 160. In the illustrated embodiment, the conductive layer 140 further forms an I/O pad 140a. The conductive layer 140 forms a connection line (140) between the I/O pad 140a and the opening 160 to establish at least part of the interconnection between the cMUT 110 and the outside. As will be shown, additional connections or components may be inserted in the connection line (140). The I/O 140a pads can be simply formed using the conductive layer 140 with a desired pattern. As will be illustrated below, if multiple conductive layers are used, the first conductive layer may not need to form an I/O pad but only needs to connect to a subsequent conductive layer which forms an I/O pad.

The packaging substrate 130 can be flexible, rigid, or flexible-rigid. The packaging substrate 130 can be made of glass or other dielectrically material with desired metal pattern.

Figure 2:
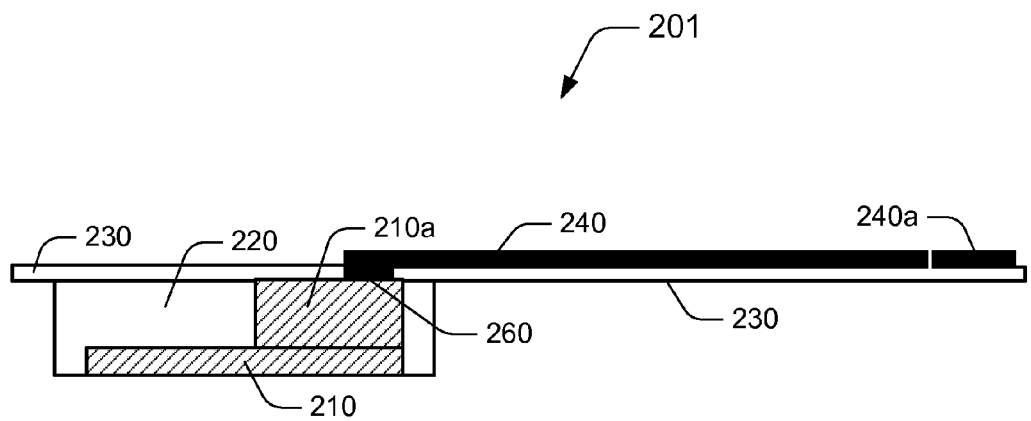
FIG. 2 illustrates a cross-section view of a second exemplary transducer packaged using the disclosed packaging methods.

FIG. 2 illustrates a cross-section view of a second exemplary transducer packaged using the disclosed packaging methods. Only one packaged transducer 201 is shown in the figure, but a packaging assembly can have multiple transducers 201 packaged in the same batch process on a same packing substrate 130, as shown in FIGS. 3-4. Instead of forming the packaging substrate 130 on the transducer side (the front side) of the fabrication substrate 120 as shown in FIG. 1, the packaging substrate 230 is formed on the non-transducer side (back side) of the fabrication substrate 220 in FIG. 2. Thus, a through wafer interconnection feature 210a is formed in order to access the transducer 210 from the backside of the fabrication substrate 220. A dielectric material layer (230) is formed on the backside of transducer fabrication substrate 220 as the packaging substrate 230. A conductive layer 240 is formed on the dielectric layer 230. Opening 260 is formed on the dielectric layer 230 so that the conductive layer 240 can connect with the through wafer interconnection feature 210a to form an electrical connection. The I/O 240a pads can be simply formed using the conductive layer 240 with a desired pattern.

The I/O pads (140a, 240a) can be made of the conductive layers with a desired pattern using any available technique, and similar I/O pads involving embodiments may be omitted from the description. In addition, except for some special cases, the methods are described using the example of forming the packaging substrate (130, 230) on the front side of the fabrication substrate for description. However, it is appreciated that the methods demonstrated on the front side of the fabrication substrate can be used to form the packaging substrate (130, 230) on back side of the fabrication substrate with a through wafer interconnection feature.

In existing cMUT packaging techniques, the electrical connection is done either using wire-bonding, directly soldering or different flip-chip bonding method. The wire-bonding and soldering is done one electrical connection at a time, and the flip-chip bonding is usually done one transducer, one chip or one component at a time. In contrast, the presently disclosed techniques fabricate or introduce a packaging substrate (130, 230) directly on the transducer(s) (e.g., cMUT transducer(s)) that are being packaged. Once the proper packaging substitute (130, 230) is fabricated or introduced, the electrical connections or interconnections for multiple transducers (or the transducer arrays) and the packaging substrate (130, 230) may be done by the semiconductor fabrication process or PCB manufacturing process. Therefore, the disclosed packaging technique does not need to package the transducer or transducer array one at a time. Further, it does not need the regular assembling/packaging method (such as wire-bonding, soldering or any kind of flip-chip methods) to do electrical connection between the transducer and the packaging substrate.

The finished packaging substrate (130, 230) can further include a desired circuit to interface with outside, like a PCB board. The circuit on the packaging substrate may be as simple as just having desired metal patterns or pads which connect with the transducers without any other electrical component (e.g., a simple fan-out board). The circuit may also have desired metal patterns or pads which connect the transducers and other electrical components such as IC chips.

In one embodiment, other electrical components such as IC chips may also be packaged together with the transducer to build a transducer system. In this case, the packaging substrate (130, 230) is directly fabricated or introduced on the transducer and other electrical components, so all electrical connections between the transducer or the transducer array, the electrical components and the packaging substrate may be done by the semiconductor fabrication process or PCB manufacturing process without requiring regular assembling/packaging methods.

More importantly, the multiple transducers, multiple other electrical components and multiple I/O pads can be packaged into multiple transducer systems (e.g., cMUT systems) in one batch process using the disclosed methods. The connections and interconnections between the transducers, other electrical components, as well as I/O pads in multiple transducer systems (cMUT systems), can be made in one fabrication process.

Furthermore, the footprint of the disclosed packaging method is defined by a lithography process, which can be much smaller than the footprint of other IC packaging method such as wire-bonding, soldering and flip-chip bonding. Furthermore, since there is no minimum pad size limitation of the bonding-wire or solder ball, the pitch between connections can be designed much smaller. Therefore, the packaging method disclosed herein can potentially yield a much higher density of the interconnections.

As will be further shown, a packaging substrate with multiple dielectric layers and conductive layers (such as metal layers) can be directly fabricated on the transducer and/or other electrical components. Not only does this increase the density and flexibility of the interconnection, but it also increases the function of the packaging substrate. For example, some electrical components or devices (e.g., capacitances, inductances, transformers, switches, and pressure sensor) can be directly fabricated or integrated in the packaging substrate fabrication process instead of being provided using external components.

The disclosed techniques may also make passivation or insulation of packaged devices much easier because there are no dangling wires and tall solder ball in the packaging and the isolation layer can be easily added.

Furthermore, in the disclosed packaging methods, if a silicon wafer or a glass wafer is selected as the supporting structure, additional semiconductor process steps may be integrated into the packaging process to further define the structure of a cMUT transducer during or after the packaging procedure. Such additional semiconductor process may not be possible if the cMUT transducer is packaged on a regular PCB or IC packages.

Using a support structure, the disclosed techniques also make it possible to packaging multiple transducers or multiple transducer arrays on the same substrate at the same batch process run in the same time. The support structure can be provided by the transducer fabrication substrate or provided by a separate structure or substrate. This advantage can drop the price of each packaged transducer dramatically.

For simplicity, FIG. 1 and FIG. 2 show only one transducer or transducer array 110 or 210. However, as will be shown for the below, any number of transducers or transducer arrays can be packaged using the method. One of the most significant advantages of the methods shown in FIGS. 1 and 2 is that the packaging of many transducer arrays can be done at the same time using the same batch packaging fabrication process run. This can dramatically lower the costs of the transducer packaging.

FIG. 3 shows a top view of multiple 1-D cMUT transducers packaged on a packaging substrate in a batch fabrication process using the methods shown in FIG. 1 or 2. The packaging assembly 300 shows total of six packaged cMUT transducers (or transducer arrays) 310 in FIG. 3, but any number of transducers 310, potentially much more than six, can be packaged together in the same packaging assembly 300. Each packaged cMUT transducer 301 comprises a one-dimensional (1-D) array 310 of multiple cMUT elements 310-1, at least one insulation layer 330 (which serves as a packaging substrate), and at least one metal layer 340. The 1-D cMUT arrays 310 are each packaged on the packaging substrate 330 which is similar to the packaging substrate (130, 230) shown in FIGS. 1-2. The opening in the dielectric layer 330, the patterns of the conductive layer 340 for multiple transducer packaging, and the connections or interconnections in multiple packaged cMUT transducer arrays 301 can be done in the same lithography step and etching step. The conductive layer 340 provides both connection lines (340) and I/O pads 340a. In the illustrated embodiment, transducer elements 310-1 in each packaged transducer array 310 are individually addressed by each having a separate connection line (340) and I/O pad 340a.

FIG. 4 shows a top view of multiple 2-D cMUT transducers packaged on a packaging substrate in a batch fabrication process using the methods shown in FIG. 1 or 2. The packaged cMUT packaging assembly 400 shows total of four packaged cMUT transducers (or transducer arrays) 401 in FIG. 4, but any number of transducers 410, potentially much more than four, can be packaged together. Each packaged cMUT transducer 401 comprises a two-dimensional (2-D) array 410 of multiple cMUT elements 410-1, at least one insulation layer 430 (which serves as a packaging substrate), and at least one metal layer 440. The packaging substrate 430 is similar to the packaging substrate 130 or 230 as shown in FIGS. 1-2. The openings in the dielectric layer 430, the patterns of the conductive layer 440 for multiple transducer packaging, and the connections or interconnections in multiple packaged cMUT transducer arrays 401 can be done in the same lithography step and etching step. In the illustrated embodiment, transducer elements 410-1 in each packaged transducer array 410 are individually addressed by having a separate connection line (440) and I/O pad 440a.

Figure 5:
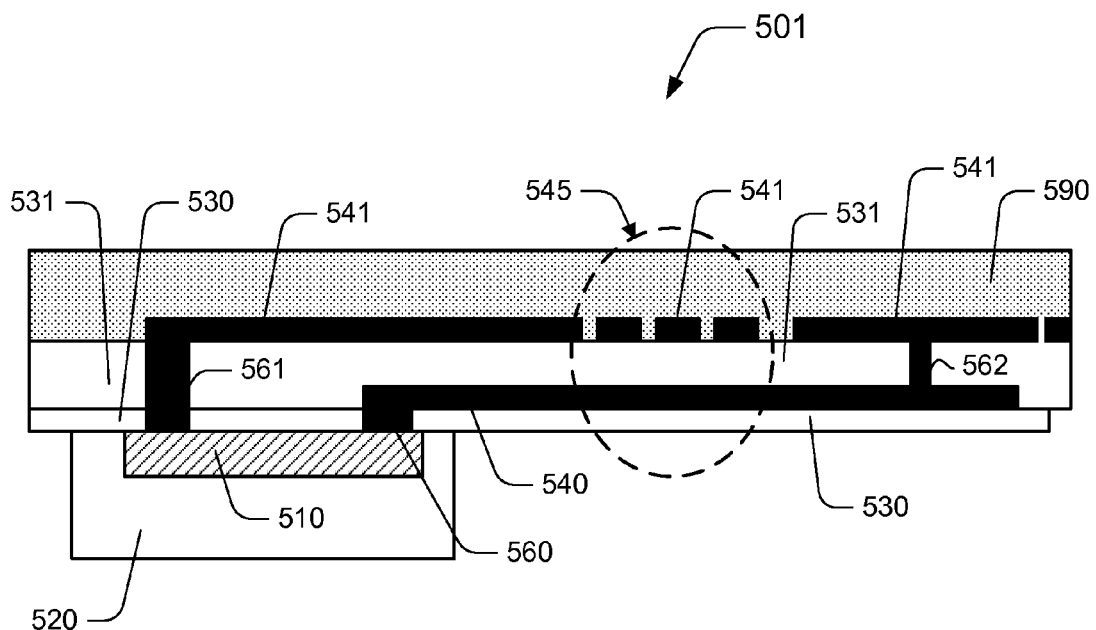
FIG. 5 illustrates a cross-section view of a third exemplary transducer packaged using the disclosed packaging methods with multiple dielectric layers and multiple conductive layers.

FIG. 5 illustrates a cross-section view of a third exemplary transducer packaged using the disclosed packaging methods with multiple dielectric layers and multiple conductive layers. In FIG. 5, multiple layers of dielectric material and metal material are used to form the packaging substrate in this embodiment.

After introducing the first packaging substrate layer 530, opening 560 over cMUT array 510 which is fabricated on fabrication substrate 520, and the first conductive layer 540 with a desired pattern, a second packaging substrate layer 531 is introduced over the first packaging substrate layer 530 and the first conductive layer 540. Another pattern including the opening 561 is formed in the second dielectric packaging substrate layer 531 over the cMUT array 510. The second conductive layer 541 is patterned over the second packaging substrate layer 531 to connect to the cMUT array 510 through the opening 561. The first conductive layer 540 may have a first I/O pad, and the second conductive layer 541 may have a second I/O pad. These I/O pad are not shown for simplicity. The second I/O pad may be connected to the first I/O pad to serve as a single connection pattern, or be separate from each other to serve as separate connection pads. The second conductive layer 541 forms a connection line between the second I/O pad and the second opening 561 over the cMUT array 510, similar to the first conductive layer 540 forming a connection line between the first I/O pad and the first opening 560. The opening 562 makes the connection between the first conductive layer 540 and the second conductive layer 541. A passivation layer or isolation layer 590 can be optionally added on the packaging substrate to finish the transducer packaging 501.

Additional functions or devices 545 (e.g., transmission lines, capacitors, inductor, pressure sensors, and switches) can be formed using multiple conductive layers (such as metal layers) and dielectric layers. Examples are described as follows.

Figure 6:
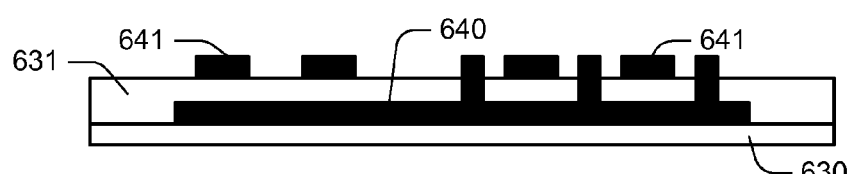
FIG. 6 illustrates a cross-section view of two exemplary types of transmission lines formed by two conductive layers and two dielectric layers.

FIG. 6 is a cross-section view of two exemplary types of transmission lines formed by two conductive layers 640 and 641 and two dielectric layers 630 and 631. The conductive layer 641 forms a signal lines, and the conductive layer 640 or combination of two conductive layers 640 and 641 forms a ground line.

Figure 7:
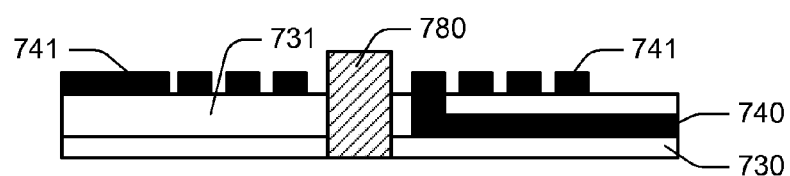
FIG. 7 illustrates a cross-section view an inductor structure formed by two conductive layers and two dielectric layers.

FIG. 7 is a cross-section view an inductor structure formed by two conductive layers 740 and 741 and two dielectric layers 730 and 731. An optional magnetic core 780 is formed within the metal coil to enhance the inductance.

Other additional electrical devices such as capacitors can be easily formed by multiple conductive layers and dielectric layers. These devices may be used to serve various functions. For example, a capacitance structure can also be used to form a pressure sensor or a switch.

Figure 8:
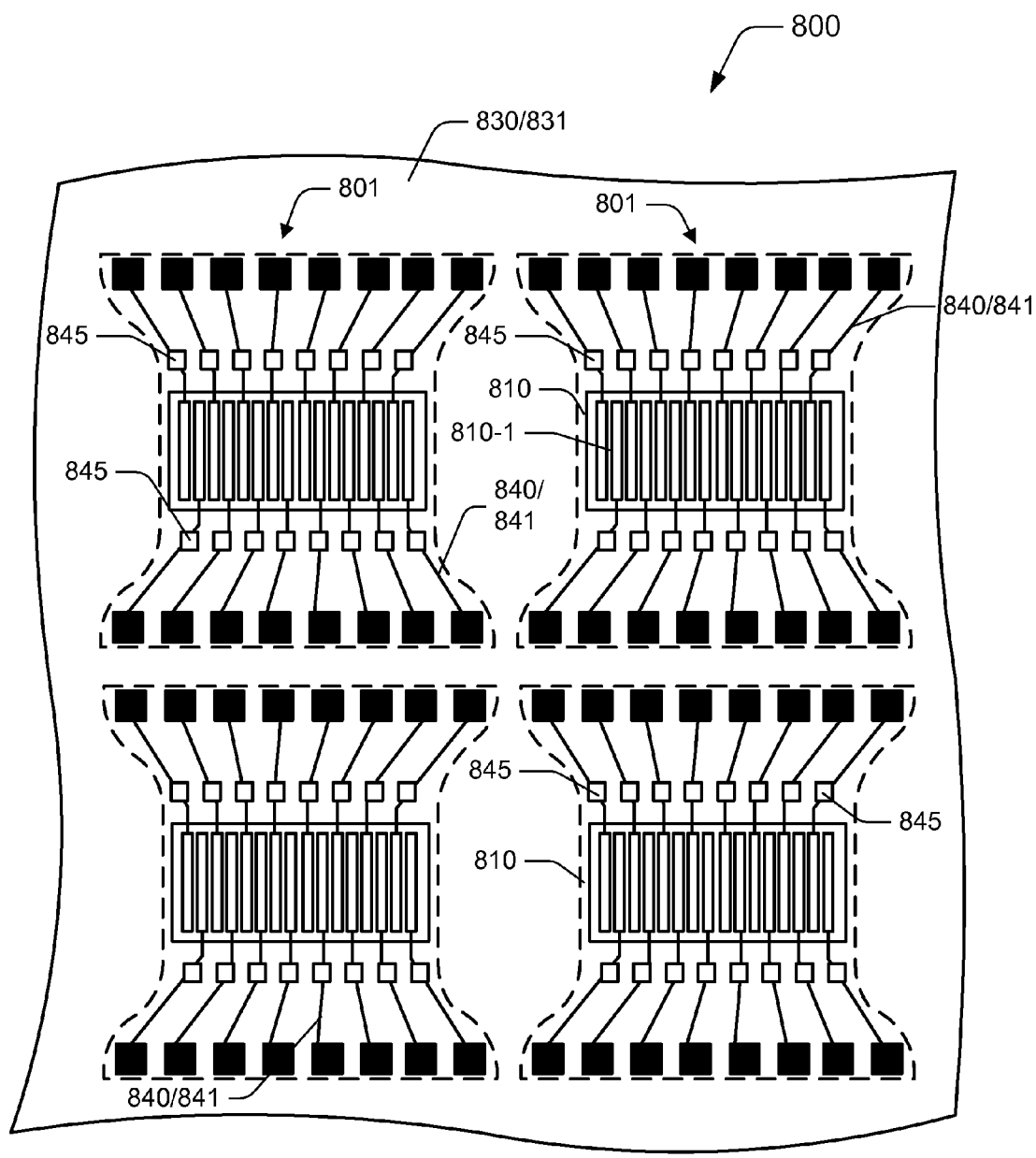
FIG. 8 illustrates a top view of multiple 1-D cMUT transducers and additional electrical devices packaged on a packaging substrate in a batch fabrication process.

FIG. 8 shows a top view of multiple 1-D cMUT transducers and additional electrical devices packaged on a packaging substrate in a batch fabrication process using the methods shown in FIGS. 5-7. The cMUT packaging assembly 800 includes multiple packaged cMUT transducers 801. Each packaged cMUT transducers 801 comprises one 1-D cMUT arrays 810 with multiple cMUT elements 810-1, at least one additional electrical device (or function) 845, insulation layers 830/831 and conductive layers 840/841. The packaged cMUTs 801 is packaged with additional electrical devices or functions 845 that are fabricated on a packaging substrate 830/831 in a batch fabrication process. The openings in the dielectric layer 830/831, the patterns of the conductive layer 840/841 in multiple packaged cMUT transducers 801, and connections and interconnections of multiple transducers 810 can all be done with the same lithography step and etching step.

The packaging techniques can also be used to package transducers and auxiliary system components, such as IC chips that are separately made, into multiple packaged cMUT systems. The transducers and the auxiliary system components in multiple cMUT systems can be packaged on the same packaging substrate using the same batch packaging fabrication process to form a system with more functions and enhanced performance, as illustrated below.

Figure 9:
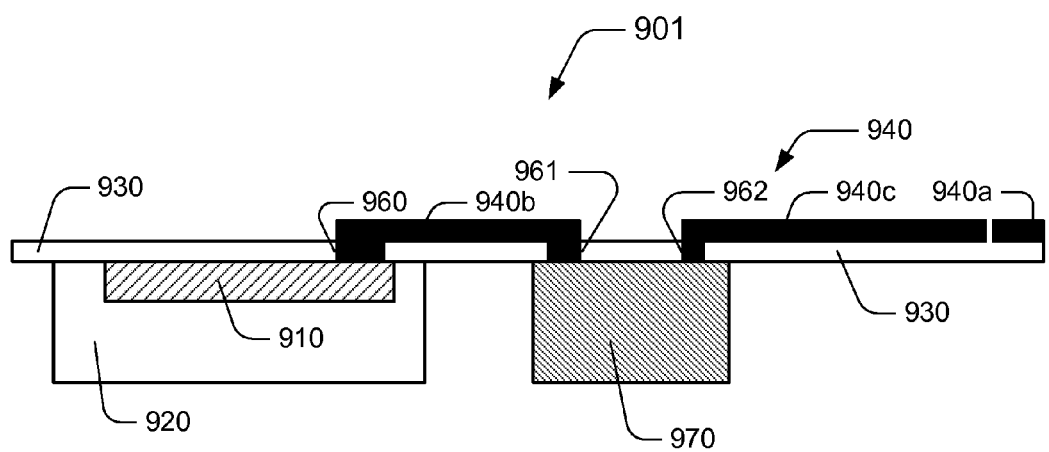
FIG. 9 illustrates a cross-section view of a fourth exemplary transducer packaged using the disclosed packaging methods.

FIG. 9 illustrates a cross-section view of a fourth exemplary transducer packaged using the disclosed packaging methods. The packaged transducer system 901 is similar to the transducer packaging 101 of FIG. 1 except that here an auxiliary system component 970 is provided and placed adjacent to the transducer (cMUT array) 910. A dielectric layer 930 is formed on the cMUT array 910 and the auxiliary system component (e.g., IC chips) 970 as the packaging substrate 930. Conductive layer 940 is formed and patterned on the dielectric layer 930. Openings 960, 961 and 962 are formed on the dielectric layer 930 so that the conductive layer 940 can contact the transducer 910 and the auxiliary system component 970 to form electrical connections. The conductive layer 940 is patterned over the dielectric layer 930 to form an I/O pad 940a and two connection lines 940b and 940c. The two connection lines 940b and 940c are generally located between the cMUT array 910 and the I/O pad to connect the two components either directly or via any intermediate system components (e.g. 970). In the illustrated implementation, the first connection line 940b connects the first opening 960 over the cMUT array 910 to the second opening 961 over the auxiliary system component 970, while the second connection line 940b connects the I/O pad 940a to the third opening 962 over the auxiliary system component 970.

Figure 10:
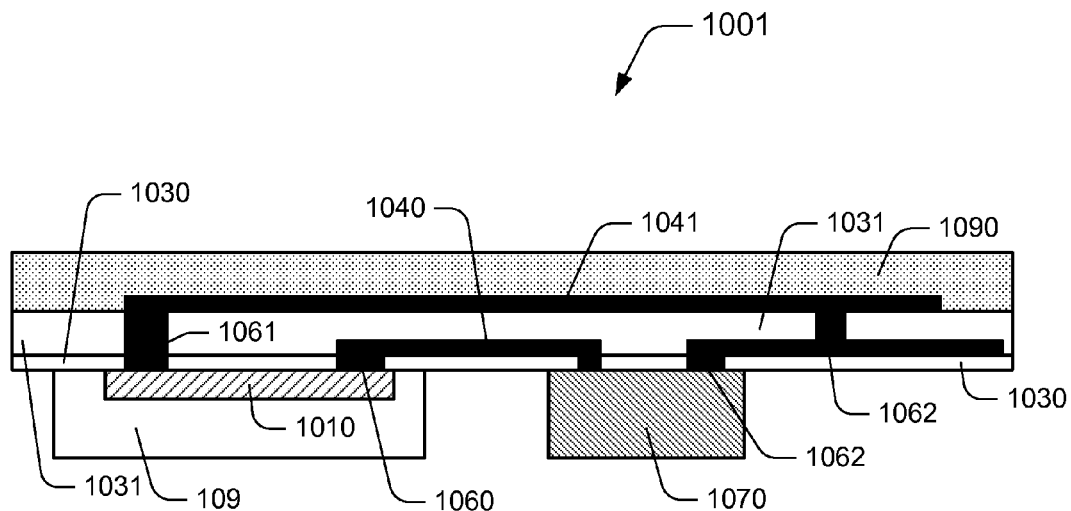
FIG. 10 illustrates a cross-section view of a fifth exemplary transducer packaged using the disclosed packaging methods.

FIG. 10 illustrates a cross-section view of a fifth exemplary transducer packaged using the disclosed packaging methods with multiple layers of conductive and insulation materials. The packaged transducer system 1001 is similar to the packaged transducer 501 of FIG. 5 except that here an auxiliary system component 970 is provided and placed adjacent to the transducer (cMUT array) 910. FIG. 10 shows multiple dielectric layers 1030 and 1031 formed on a cMUT transducer 1010 and an auxiliary system component 1070 as the packaging substrate. Multiple conductive layers 1040 and 1041, which are sandwiched with the dielectric layers 1030 and 1031, are formed and patterned. Multiple openings such as 1060, 1061 and 1062 are formed in the dielectric layers 1030 and 1031 so that the conductive layers 1040 and 1041 can contact the transducer 1010 and the electrical component 1070 or contact each other to form desired electrical connections. The multiple dielectric layers 1030 and 1031 and multiple conductive layers 1040 and 1041 can also form other additional functions or electrical components during packaging. In addition, a passivation layer or isolation layer 1090 can be optionally added on the packaging substrate.

Figure 11:
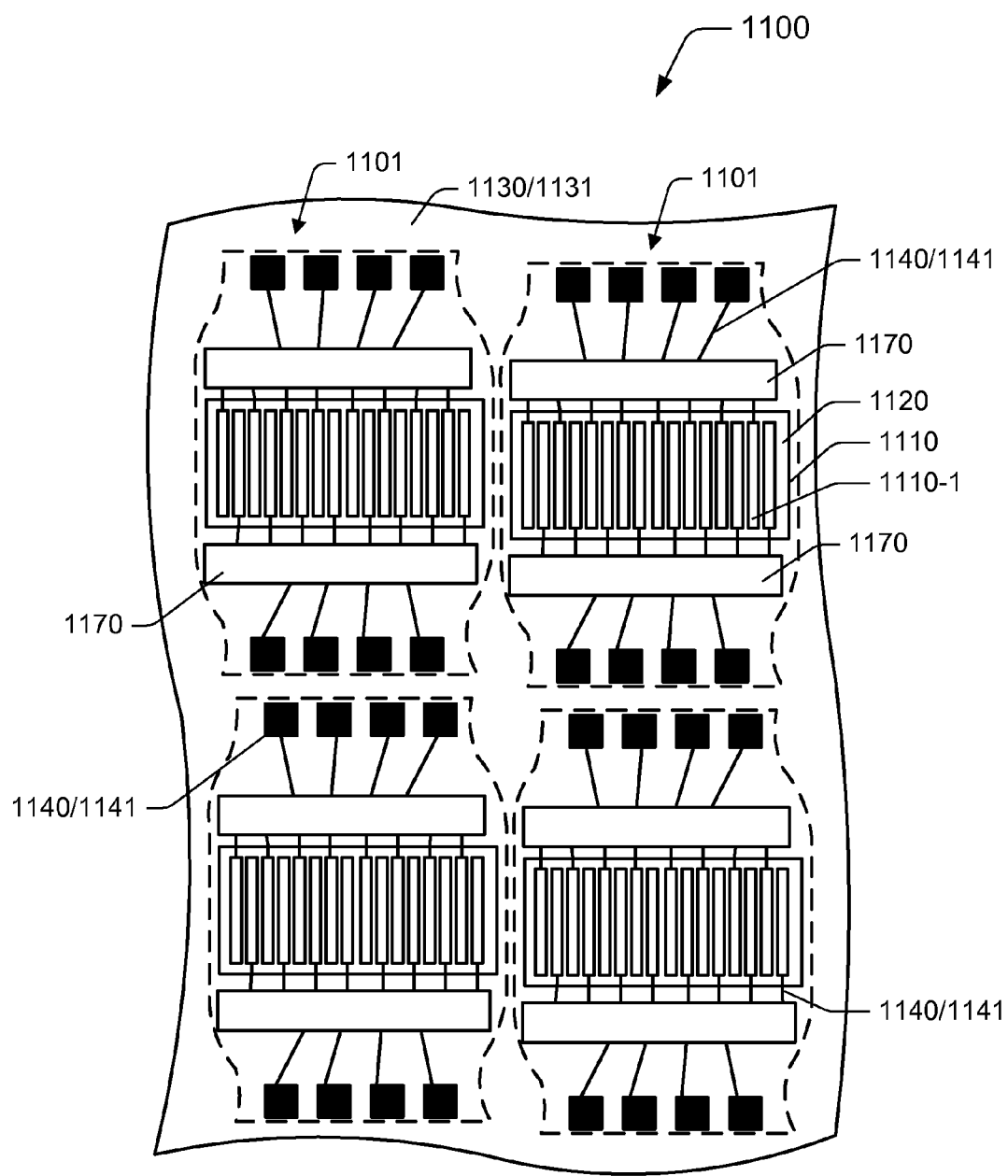
FIG. 11 illustrates a top view of multiple 1-D cMUT transducers and auxiliary system components packaged on a packaging substrate in a batch fabrication process.

FIG. 11 shows a top view of multiple 1-D cMUT transducers and auxiliary system components packaged on a packaging substrate in a batch fabrication process using the methods shown in FIG. 9 or 10. The transducer packaging assembly 1100 is similar to the transducer packaging assembly 300 of FIG. 3, except auxiliary system components 1170 are packaged together with the transducers 1110. FIG. 11 shows that multiple transducers 1110 (arrays) fabricated on fabrication substrate 1120 and multiple auxiliary system components 1170 are packaged on a packaging substrate 1130/1131 to form multiple packaged cMUT systems 1101. In each packaged cMUT systems 1101, the transducer array 1110 is packaged with two auxiliary system components 1170 as illustrated, but any combination can be used. In the embodiment illustrated, each transducer array 1110 has a 1-D array of multiple transducer elements 1110-1. The packaging of the entire transducer assembly 1100 with multiple packaged cMUT systems 1101 can be done in the same batch process run. For example, the openings in the dielectric layer 1130/1131, the patterns of the conductive layer 1140/1141 in multiple packaged cMUT systems 1101 can be done by the same lithography step and etching step.

In FIGS. 5-8 and FIGS. 10-11, only two layers of conductive layers and insulation layers are used to illustrate a multilayered packaging process using a packaging substrate. However, more layers of conductive layers and insulation layers can be used in the disclosed packaging methods.

In all embodiments, acoustic windows may be optionally opened on the active area of the cMUT transducer by removing the packaging substrate material.

One advantages of this method is that the multiple transducer systems with transducers and other electric components (e.g., IC chips) can be packaged in a single batch fabrication process run at the same time. This dramatically decreases the cost of packaging complex transducer systems. Moreover, all components in the system (e.g., transducers, electrical components and IC chips) can be tightly integrated together to save the space.

Packaging Process

The process of packaging transducers is described below using multiple examples. Unless otherwise noted, the packaging structures illustrated are all cross-section views. In this description, the order in which a process is described is not intended to be construed as a limitation, and any number of the described process blocks may be combined in any order to implement the method, or an alternate method.

Figure 12:
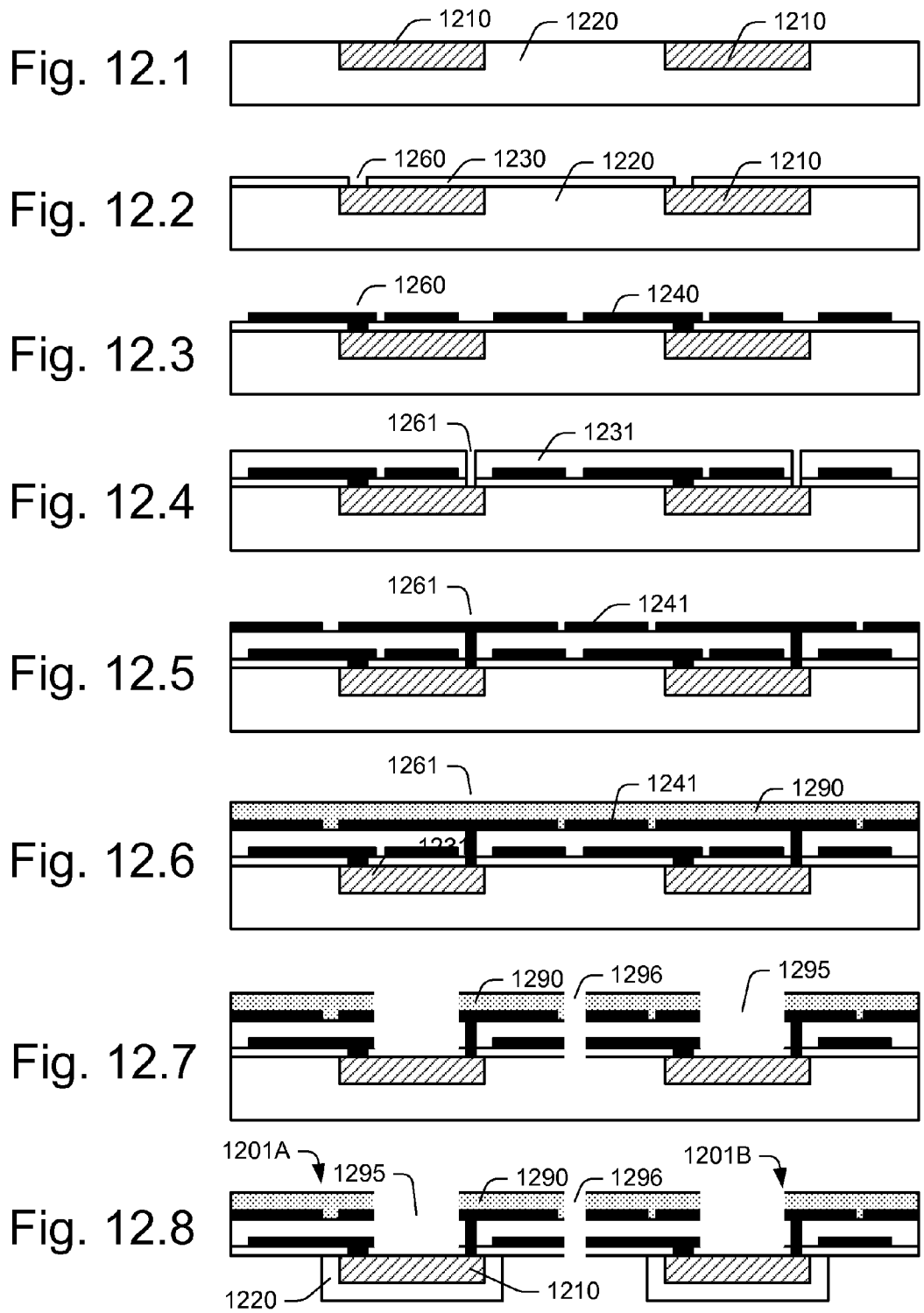
FIG. 12 illustrates a first exemplary packaging process which forms the packaging substrate on the transducer fabrication substrate directly.

FIG. 12 illustrates a first exemplary packaging process which forms the packaging substrate on the transducer fabrication substrate directly.

At the step one (FIG. 12.1), cMUTs or cMUT arrays 1210 with desired features are fabricated on a substrate (e.g., silicon, glass) 1220. The cMUT 1210 may be any suitable cMUT or cMUT array with multiple cMUT elements produced with a suitable method. This fabrication process is done prior to packaging.

At step two (FIG. 12.2), a layer 1230 of a material is placed on the top of the substrate 1220 which has cMUT 1210. The layer 1230 preferably is a dielectric material (e.g., PDMS, Parylene, nitride film, oxide film, polyimide, Riston, Kapton, photoresist, and other suitable polymers). The dielectric material can be deposited, coated, laminated, or bonded on the substrate 1220. Opening 1260 may be formed on the material layer 1230 to access the electrodes of the cMUT 1210.

At step three (FIG. 12.3), a conducted layer 1240 (e.g., Al, Au, Cu or polysilicon) is formed and patterned to electrically connect the cMUT or cMUT array 1210. The conductive layer 1240 can also be patterned to form I/O pads or electrodes for other function or components. The conductive layer 1240 can be formed varies methods, such as being deposited, sputtered or electroplated. Optionally, step two (FIG. 12.2) and step three (FIG. 12.3) can be repeated if a multiple-layer packaging substrate (such as that shown in FIG. 5) is desired. The next step is an example.

At step four (FIG. 12.4), a second dielectric layer 1231 is formed and patterned. The opening 1261 can be formed for interconnection between conductive layers and transducers or between different conductive layers.

At step five (FIG. 12.5), the second conducted layer 1241 is formed and patterned. Similar to the above step four (FIG. 12.4) and step five (FIG. 12.5), step two (FIG. 12.2) and step three (FIG. 12.3) can be optionally repeated multiple times if multiple-layer packaging substrate is desired.

At step six (FIG. 12.6), a passivation layer or isolation layer 1290 is optionally added on the top of the packaging substrate. The passivation layer or isolation layer 1290 is preferably a dielectric material such as PDMS, Parylene, nitride film, oxide film, Riston, Kapton, photoresist, other polymer, and polyimide.

At step seven (FIG. 12.7), a window 1295 is optionally opened to improve the transducer performance. For example, the materials on the front of the active area of a cMUT 1210 may be removed for better acoustic wave transmission and reception. A trench 1296 may also be formed at the same time for easy separation of the packaged transducers in next step.

At the last step (FIG. 12.8), the transducer substrate 1220 can be optionally patterned to a desired shape if needed. The packaging of cMUT transducers 1201A and 1201B is then finished.

In the packaging process illustrated above, the packaging substrate is introduced or fabricated on the fabrication substrate of the transducer. However, transducers may be fabricated in any manner, separated into transducer devices (such as individual transducer arrays) to be packaged, and assembled in another (third) substrate such as a separate support structure, as illustrated below.

Figure 13:
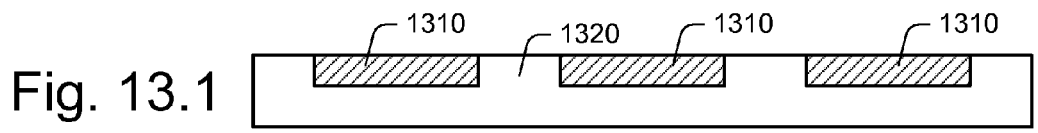
FIG. 13 illustrates a second exemplary packaging process which packages transducers using a packaging support structure.
Figure 13:
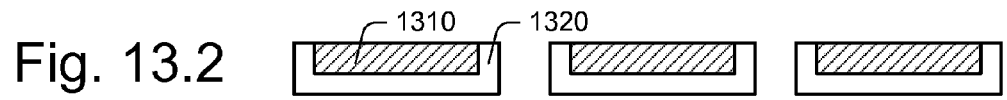
Figure 13:
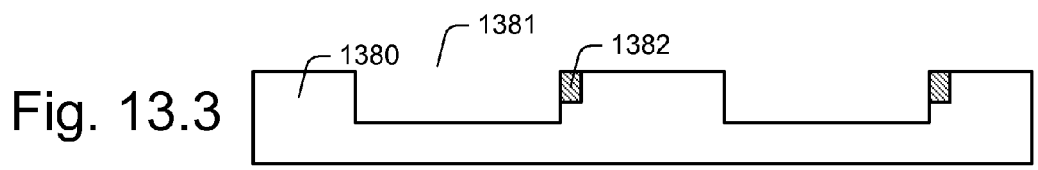
Figure 13:
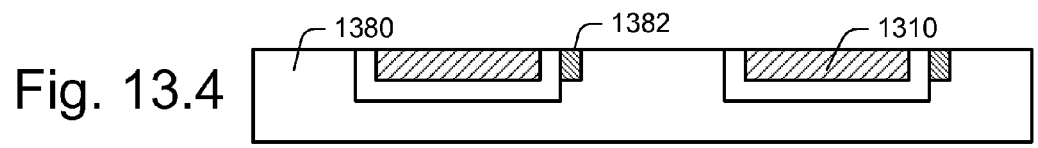
Figure 13:
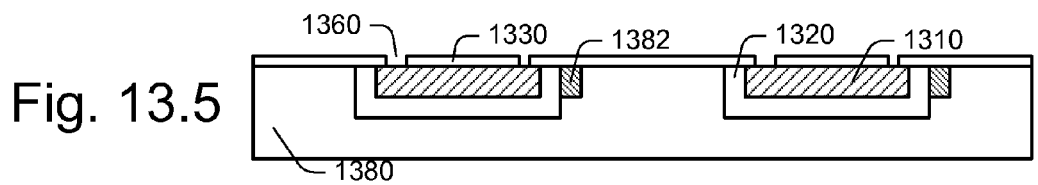
Figure 13:
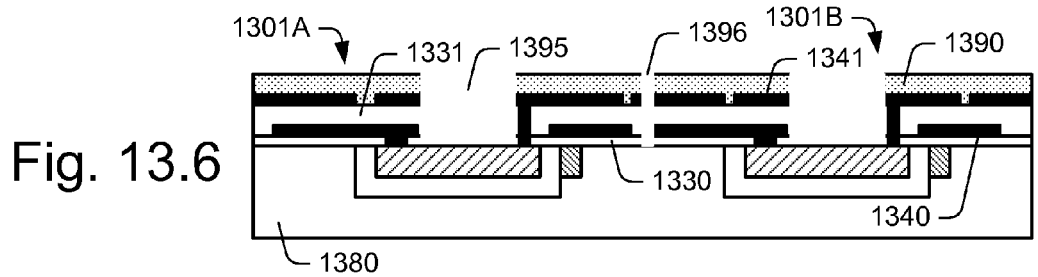
Figure 13:
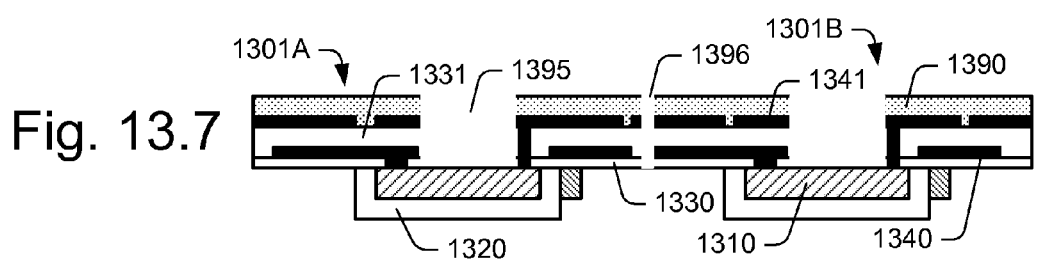

FIG. 13 illustrates a second exemplary packaging process which packages transducers using a packaging support structure.

At step one (FIG. 13.1), cMUTs or cMUT arrays 1310 with desired features are fabricated on a fabrication substrate 1320.

At step two (FIG. 13.2), the cMUT arrays 1310 are separated (e.g., etched or diced) from the rest of the fabrication substrate. At this point, each cMUT array 1310 may be a discrete piece.

At step three (FIG. 13.3), a third substrate 1380 is used as a support structure to host the cMUT arrays 1310 to be packaged. The packaging support structure provides a cMUT array holder for each cMUT array 1310. The cMUT arrays are attached to the cMUT array holders with the first side of the cMUT array facing up before introducing the first dielectric packaging substrate layer over the first side of the cMUT array. FIG. 13.3 illustrates an exemplary cMUT array holder. Cavities 1381 with a desired size are opened in the third substrate 1380, which is used as a support structure for packaging. In each cavity 1381, a retaining member 1382 (e.g., a spring structure or a latch structure) may be formed to help secure the cMUT array to be added in next step. The third substrate 1380 can be silicon substrate/wafer, glass substrate or metal substrate, or any other suitable material to provide support for packaging.

It is noted that in some embodiments, the third substrate 1380 may be used as a mechanical support only and not be required to provide other functions such as forming devices. In these embodiments, the third substrate 1380 may be made of a very inexpensive material and can be of any manageable size (and not limited to the wafer size known in the semiconductor processing).

At step four (FIG. 13.4), the separated cMUTs 1310 with their respective fabrication substrates 1320 are placed into cavities 1381. If needed, a material (e.g., PDMS, photoresist, polyimide, and wax) may be added to glue the cMUT substrate 1320 with the substrate 1380.

At step five (FIG. 13.5), a dielectric layer 1330 serving as a packaging substrate is placed on the top of the cMUT 1310 in the fabrication substrate 1320 and the support substrate 1380. Opening 1360 may be formed on the material layer 1330 to access the electrodes on the cMUT 1310. After this step, the subsequent process can be same as the process of FIG. 12 from FIG. 12.3 to FIG. 12.7.

FIG. 13.6 shows the fabrication result after performing the process from FIG. 12.3 to FIG. 12.7. The cMUT package in FIGS. 13.6 includes cMUT transducer 1310 with its fabrication substrate 1320, dielectric layers 1330 and 1331, conductive layers 1340 and 1341, the support substrate 1380, insulation/passivation layer 1390 and trenches 1396.

At the last step (FIG. 13.7), the support substrate 1380 may be removed to obtain the packaged cMUTs 1301A and 1301B if desired to. The removed support substrate 1380 may be re-useable.

As shown above, a packaging support substrate (1380) provides cMUT array holders to hold the cMUT arrays. The cMUT array holders may be provided in a variety of ways. The above method of using cavities formed in the packaging support structure is only an example. More examples are described below the reference to FIGS. 14-17 showing different methods to place the transducers on a third substrate used as a packaging support structure. After the transducers are securely placed in the third substrate, the subsequent process is similar to the process shown in FIG. 13.

Figure 14:
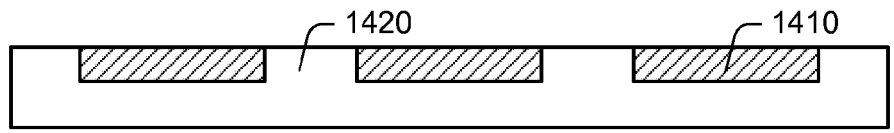
FIG. 14 illustrates a third exemplary packaging process which packages transducers using a packaging support structure.
Figure 14:
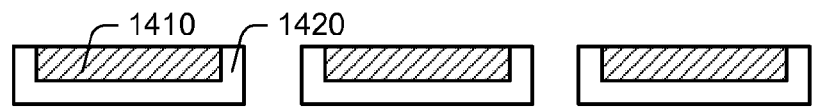
Figure 14:
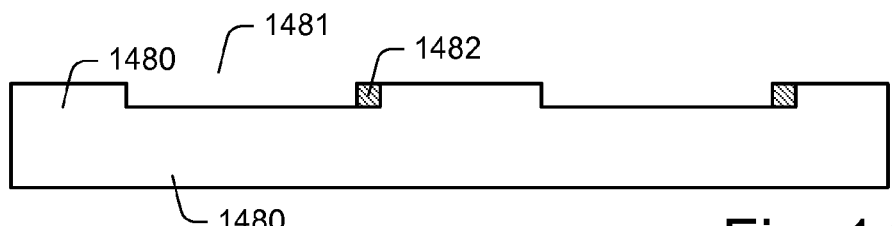
Figure 14:
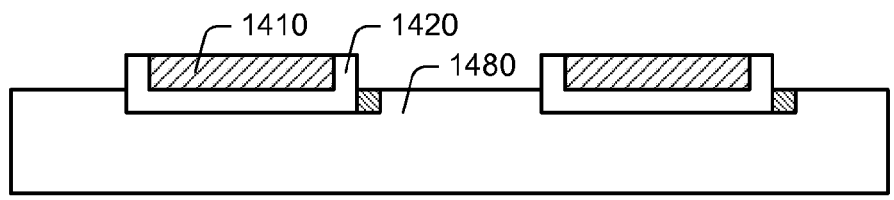
Figure 14:
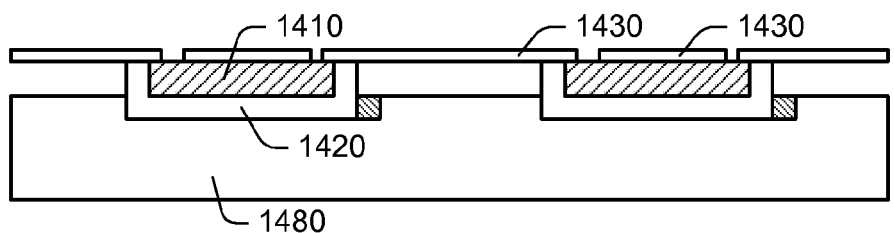

FIG. 14 illustrates a third exemplary packaging process which packages transducers using a packaging support structure. In this embodiment, step one through step four (FIG. 14.1-FIG. 14.4) are the same as step one to step four (FIG. 13.1-FIG. 13.4) in FIG. 13. The cMUT 1410 in the fabrication substrate 1420 are placed in receptacles (cavities) 1481 in the third substrate 1480. However, after the transducer 1410 has been assembled, the top surface of transducer 1410 and the top surface of the third substrate 1480 are not at the same level.

At step five (FIG. 14.5), the first dielectric layer 1430 is laminated or bonded on the transducer surface. After the formation of the first dielectric layer 1430, the process is the same as the process shown in FIG. 13. The cavity 1481 and the transducer latch structure 1482 are optional in this process.

Figure 15:
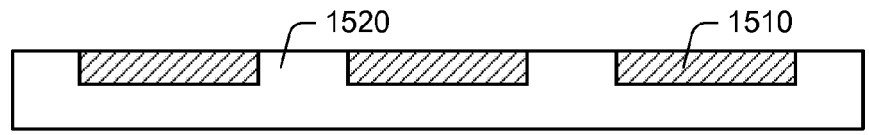
FIG. 15 illustrates a fourth exemplary packaging process which packages transducers using a packaging support structure.
Figure 15:
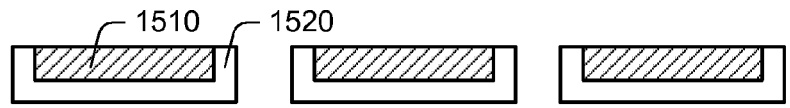
Figure 15:
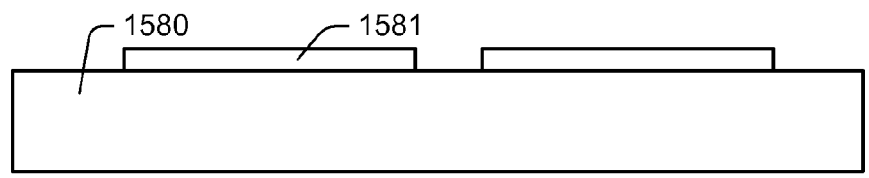
Figure 15:
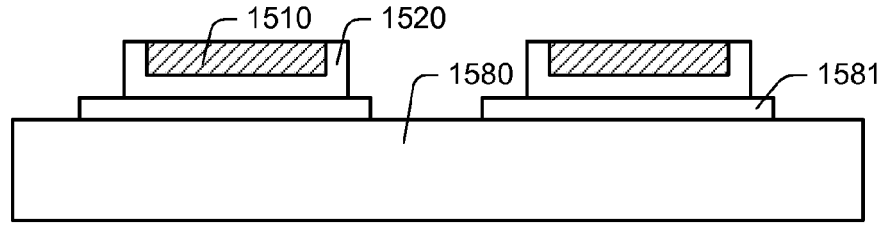
Figure 15:
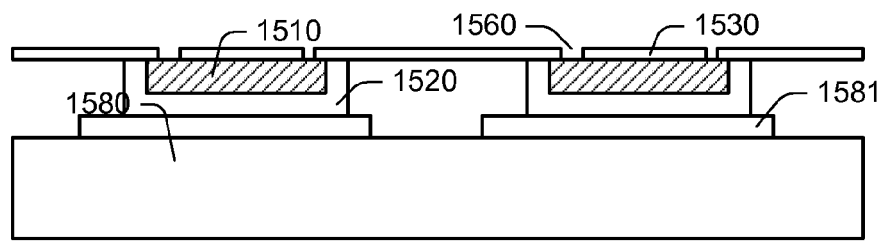

FIG. 15 illustrates a fourth exemplary packaging process which packages transducers using a packaging support structure. The first two steps (FIG. 15.1 and FIG. 15.2) of the process in FIG. 15 are the same as first two steps (FIG. 13.1 and FIG. 13.2) of the process in FIG. 13. The cMUT arrays 1510 are fabricated on the fabrication substrate 1520 and separated from the fabrication substrate 1520 for placement into a packaging support structure.

At step three (FIG. 15.3), a fastening member 1581 is formed and patterned on the third substrate 1580. Instead of using a cavity, the fastening member 1581 is used as a cMUT holder. The fastening member 1581 may be an adhesion structure, a structure with a mechanical fastener, or a self-assembling pad.

At step four (FIG. 15.4), the cMUT array 1510 is placed and fastened on the fastening member 1581.

At step five (FIG. 15.5), a dielectric layer 1530 introduced on the transducer surface. A pattern with an opening 1560 is formed on the dielectric layer 1530. After the formation of the dielectric layer 1530, the subsequent process is the same as the process shown in FIG. 13.

Figure 16:
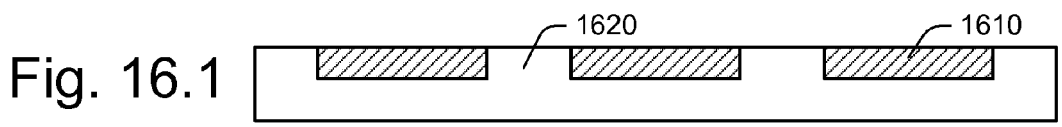
FIG. 16 illustrates a fifth exemplary packaging process which packages transducers using a packaging support structure.
Figure 16:
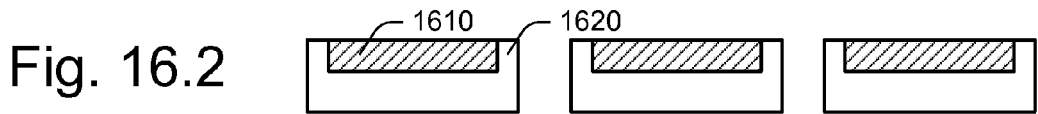
Figure 16:
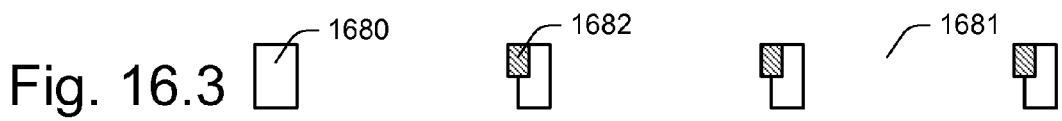
Figure 16:
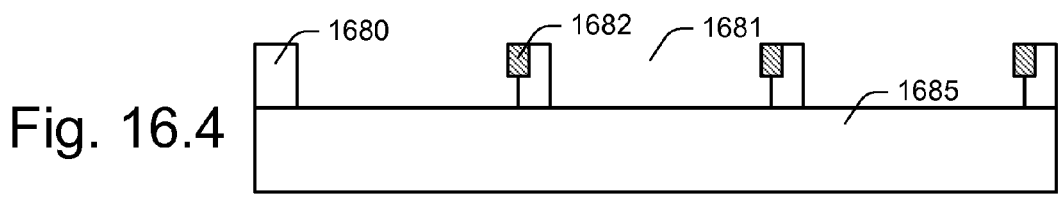
Figure 16:
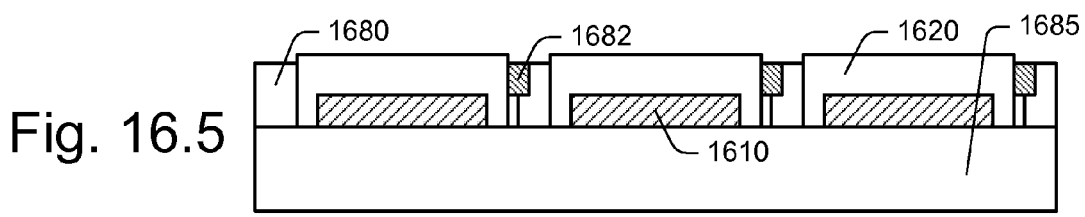
Figure 16:
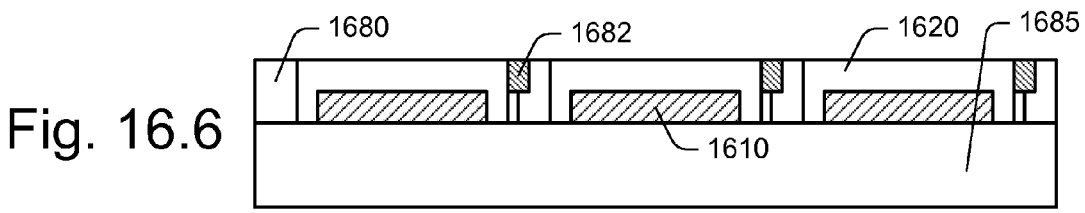
Figure 16:
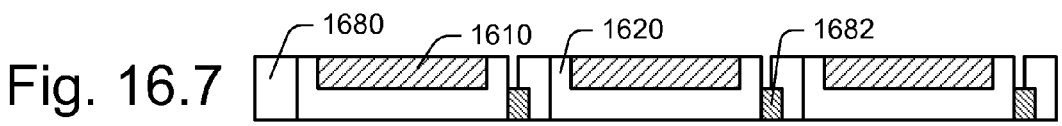
Figure 16:
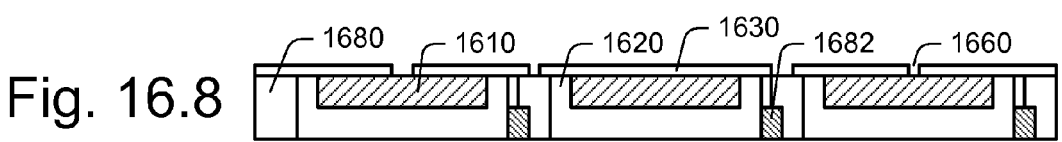

FIG. 16 illustrates a fifth exemplary packaging process which packages transducers using a packaging support structure. In this embodiment, the cMUT array holder is a receiving cavity formed of a supplemental support layer placed over a top surface of a support base layer of the packaging support structure.

The first two steps (FIG. 16.1 and FIG. 16.2) of the process in FIG. 16 are the same as first two steps of the process in FIG. 13.

At step three (FIG. 16.3), through wafer holes or cavities 1681 with a desired size and thickness are opened in a third substrate 1680. In each cavity, a retaining member 1682 (e.g., a spring structure or a latch structure) may be formed to help secure the cMUT added in next step. The third substrate 1680 can be a silicon substrate/wafer, glass substrate or metal substrate.

At step four (FIG. 16.4), the patterned third substrate 1680 is placed on a fourth substrate 1685 with a flat surface. Optionally, the structure in FIG. 16.4 is formed on a SOI wafer with cavities 1681 etched to stop at an insulation layer of the SOI wafer. The insulation layer them forms the flat surface.

At step five (FIG. 16.5), the cMUTs 1610 with their fabrication substrates 1620 are placed into to the cavities 1681. In the example illustrated, the cMUTs 1610 are received into the cavities 1681 front side down. If needed, an adhesion material (e.g., PDMS, photoresist, polyimide, epoxy, and wax) may be added to glue the cMUT fabrication substrate 1620 to the third substrate 1680. The transducer fabrication substrate 1620 may be thicker than, thinner than or the same as the thickness of the third substrate 1680.

At step six (FIG. 16.6), the surface of the resultant structure after step five may be ground or polished if it is not flat.

At step seven (FIG. 16.7), the fourth substrate 1685 is removed to expose the front side of the cMUT arrays 1610 so that further process can be finished on the transducer's front surface. In FIG. 16.7, in the third substrate 1680 containing the cMUT arrays 1610 is reversed to show its front side facing up.

At step eight (FIG. 16.8), a dielectric layer 1630 is placed on the top of the substrate 1620 with cMUT 1610. Openings 1660 may be formed on the material layer 1630 to access the electrodes on the cMUT 1610. After the formation of the first dielectric layer 1630, the subsequent process is the same as the process shown in FIG. 13.

Figure 17:
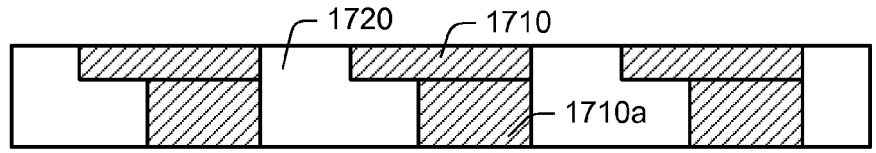
FIG. 17 illustrates a sixth exemplary packaging process which packages transducers using a packaging support structure.
Figure 17:
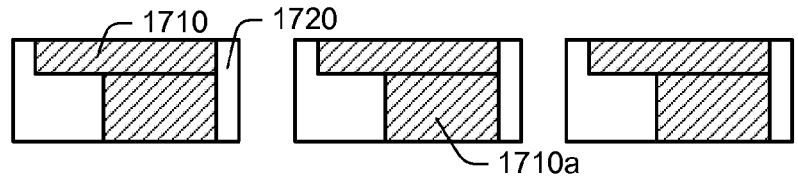
Figure 17:
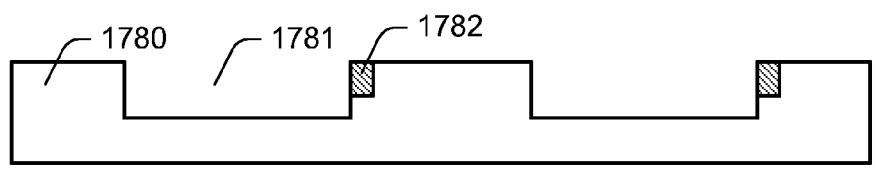
Figure 17:
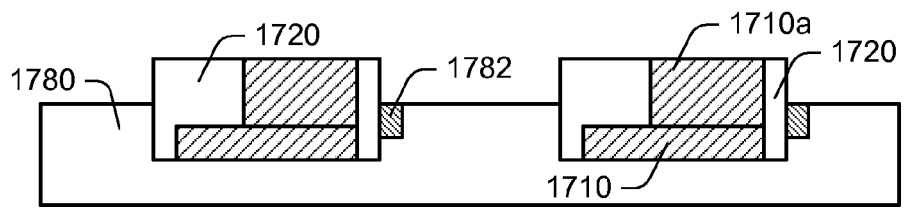
Figure 17:
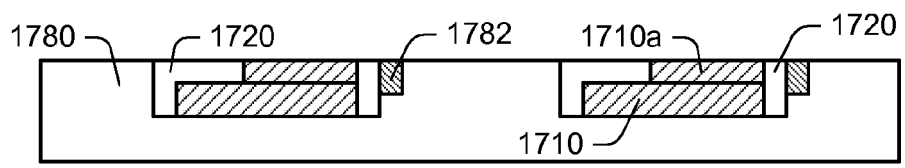
Figure 17:
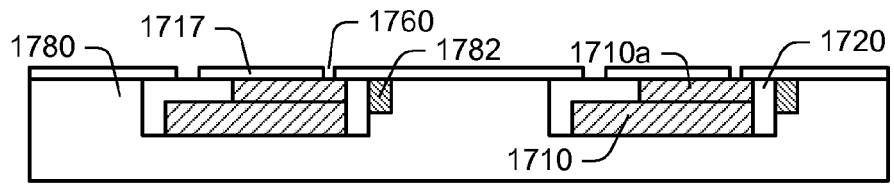

FIG. 17 illustrates a sixth exemplary packaging process which packages transducers using a packaging support structure. In this embodiment, the packaging substrate 1730 is fabricated on the backside of the transducer's fabrication substrate 1720.

At step one (FIG. 17.1), a cMUT or cMUT array 1710 with desired features are fabricated on a cMUT fabrication substrate 1720. A through-wafer interconnection feature 1710a is added in the transducer 1710 to provide connection access to the transducer 1710 from the back. In FIG. 17.1, the cMUT array 1710 is shown face up.

At step two (FIG. 17.2), the fabrication substrate 1720 is patterned or diced to separate the fabricated cMUT arrays 1710 from the rest of the fabrication substrate 1720.

At step three (FIG. 17.3), cavities 1781 with desired size is opened in the third substrate 1780. In each cavity, a retaining member 1782 may be formed to help secure the cMUT 1710 added in next step. The third substrate 1780 can be a silicon substrate/wafer, a glass substrate or a metal substrate.

At step four (FIG. 17.4), the cMUT 1710 with the cMUT fabrication substrate 1720 are placed into cavities 1781, face down. If needed, an adhesive or filling material may be added to glue the cMUT substrate 1720 with the third substrate 1780 and may also fill the gaps between the substrates 1720 and 1780.

At step five (FIG. 17.5), if the bottom surface (facing upward) of the cMUT 1710 is not level with the top of the third substrate 1780 after process step four, it may be ground and polished to make the cMUT 1710 thinner and level with the top surface of the third substrate 1780. Furthermore, the whole surface including the bottom surface of the cMUT 1710 and the top surface of the third substrate 1780 can be ground and polished thinner to achieve a flat surface. This gives more process flexibility to add the packaging substrate (dielectric layer 1730) in the next step. In FIG. 17.5, the cMUT 1710 is shown to have the bottom surface facing up.

At step six (FIG. 17.6), the first dielectric layer 1730 is placed on of the substrate 1720 with cMUT 1710. Openings 1760 may be formed on the dielectric layer 1730 to access the through-wafer interconnection features 1710a on the cMUT 1710. After the formation of the first dielectric layer 1730 (Step six, FIG. 17.6), the process is the same as the process shown in FIG. 13.

Figure 18:
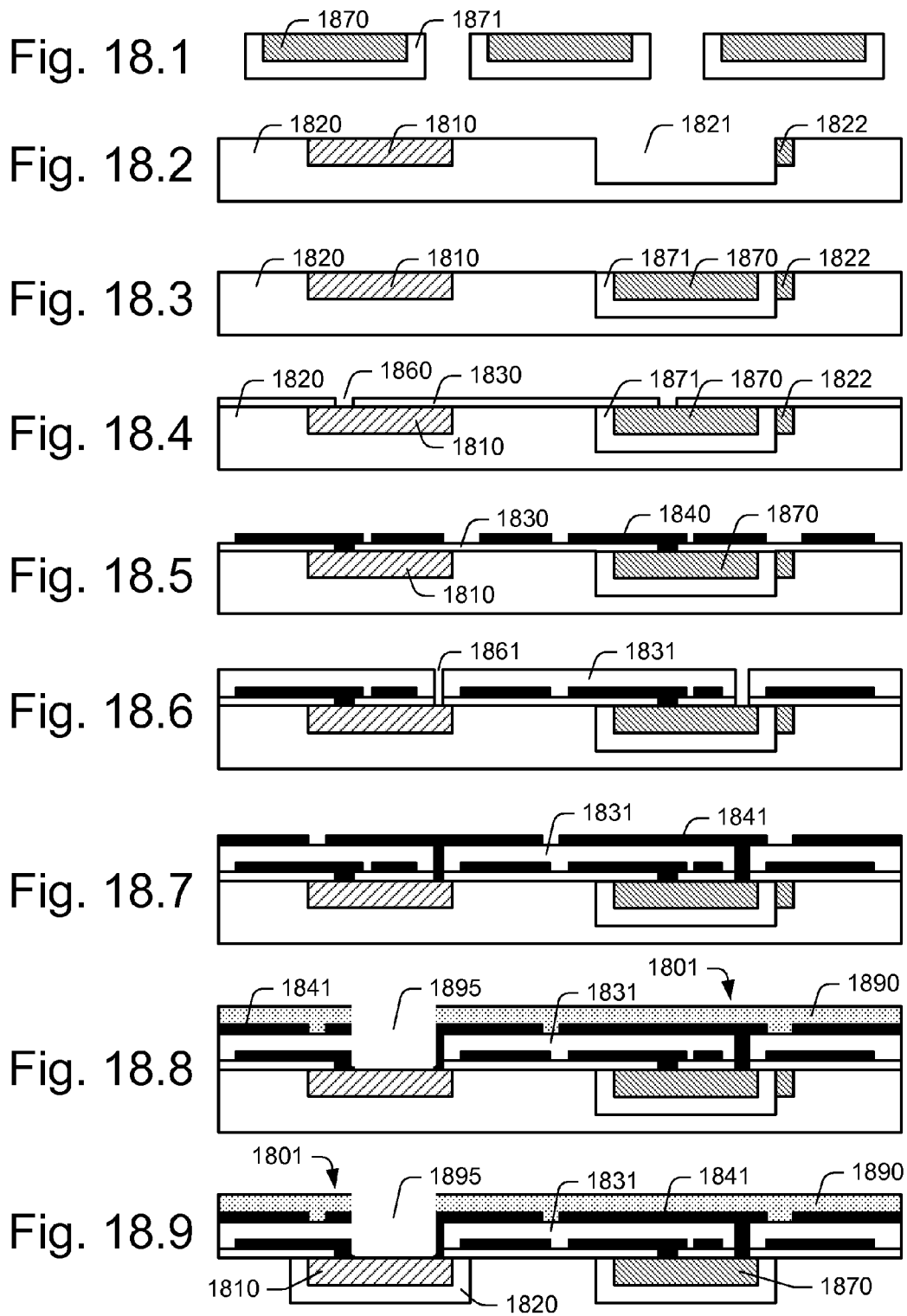
FIG. 18 illustrates a seventh exemplary packaging process which packages transducers and auxiliary system components directly on a fabrication substrate.

FIG. 18 illustrates a seventh exemplary packaging process which packages transducers and auxiliary system components directly on a fabrication substrate to form the packaged cMUT systems. In this embodiment, transducer 1810 and auxiliary system components 1870 (e.g., IC chips or any other electrical components of the transducer system) are packaged on the packaging substrate. Additional circuits may also be formed during packaging. All electrical connections between cMUT 1810 and system components 1870 may be done during the packaging substrate fabrication.

At step one (FIG. 18.1), the system components 1870 are fabricated on the fabrication substrate 1871 and then cut (diced or etched) from the fabrication substrate 1871.

At step two (FIG. 18.2), a cMUT or cMUT array 1810 are fabricated on its fabrication substrate 1820. Cavities 1821 with a desired size are opened in the transducer fabrication substrate 1820. In each cavity, a retaining member 1822 may be formed to help secure the system components 1870 to be added in next step.

At step three (FIG. 18.3), the system component 1870 is placed into cavity 1821. If needed, an adhesive material may be added to glue the component 1870 with the substrate 1820.

At step four (FIG. 18.4), a dielectric layer 1830 is placed on the top of the cMUT 1810 and the system component 1870 as a packaging substrate layer. Opening 1860 may be formed on the dielectric layer 1830 to access the electrodes on the cMUT 1810 and the system components 1870.

At step five (FIG. 18.5), a conductive layer 1840 (e.g., Al, Au, Cu or polysilicon) is formed and patterned to electrically connect the cMUT or cMUT array 1810 and the system component 1870. The conductive layer can also be patterned to form I/O pads or electrodes for other function or components. Optionally, Step four and Step five can be repeated if a multiple-layer packaging substrate is desired as other shown below.

At step six (FIG. 18.6), one more dielectric layer 1831 can be optionally formed and patterned. The opening 1861 can be formed for interconnection between conductive layer and transducers, between conductive layer and system components, or between different conductive layers.

At step seven (FIG. 18.7), one more conductive layer 1841 can be optionally formed and patterned. Similar to steps six and seven, steps four and five can be optionally repeated multiple times if multiple-layer packaging substrate is desired.

At step eight (FIG. 18.8), a passivation layer or isolation layer 1890 may be added on the top of the packaging substrate. A window 1895 may be optionally opened to improve the transducer performance. For example, the materials on the front of the active area of a cMUT 1810 maybe removed for better acoustic wave transmission and reception. Additional trenches can be opened between the packaged cMUT systems 1801 when etching the windows 1895 so that the individual packaged systems 1801 can be separated easily later.

At the last step (FIG. 18.9), the transducer substrate 1820 can be optionally patterned to a desired shape if needed to obtain the packaged cMUT systems 1801. Although only one cMUT system is shown in the FIG. 18, the packaging of multiple cMUT systems 1801 can be done on the packaging substrate using the same method.

Figure 19:
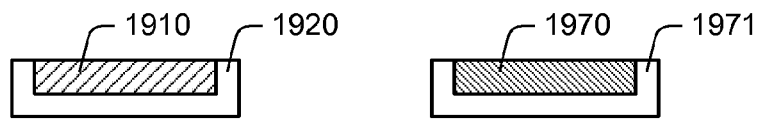
FIG. 19 illustrates an eighth exemplary packaging process which packages transducers and auxiliary system components using a packaging support structure.
Figure 19:
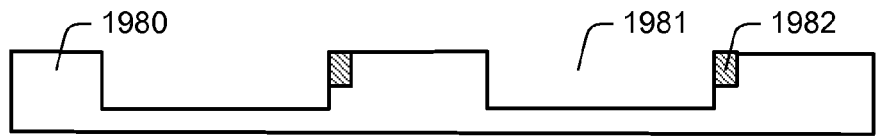
Figure 19:
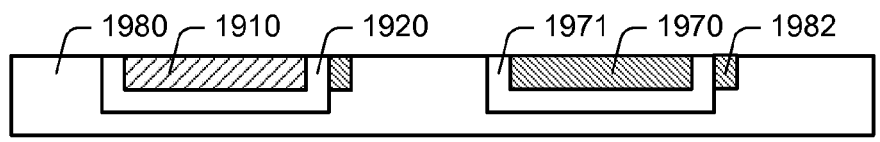
Figure 19:
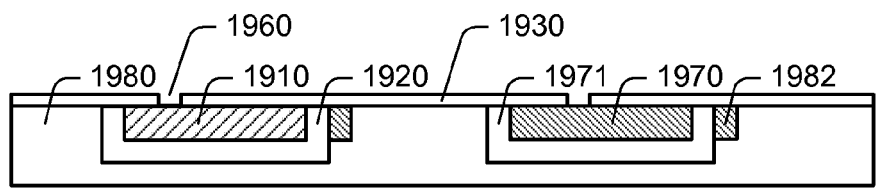
Figure 19:
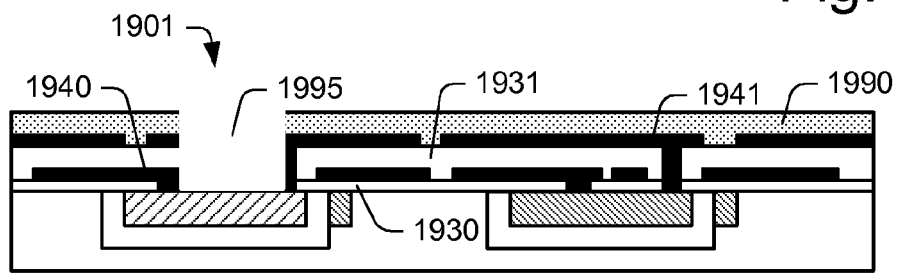
Figure 19:
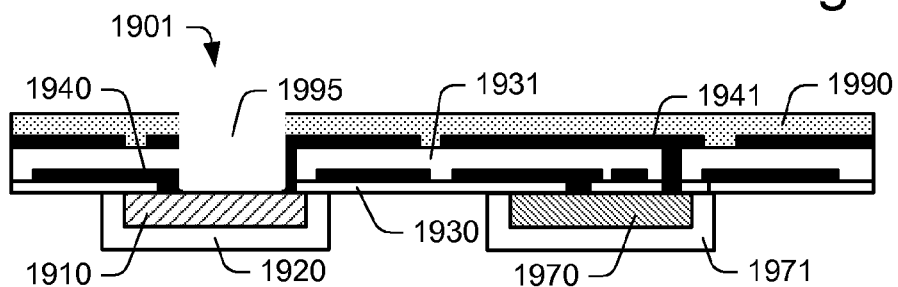

FIG. 19 illustrates an eighth exemplary packaging process which packages transducers and auxiliary system components using a packaging support structure into packaged cMUT systems. Like in the packaging process of FIG. 18, both transducers 1810 and auxiliary system components 1870 are packaged on the packaging substrate. Different from the method in FIG. 18, the packaging fabrication method shown in FIG. 19 is done on a third substrate 1980 serving as a packaging support structure instead of on the transducer fabrication substrate 1920.

At step one (FIG. 19.1), the cMUT or cMUT array 1910 are separated from its fabrication substrate 1920 and the system components 1970 are separated from its fabrication substrate 1971. The separation may be done using any suitable method such as dicing or etching.

At step two (FIG. 19.2), cavities 1981 with desired size are opened in the third substrate 1980. In each cavity 1981, a retaining member 1982 may be formed to help secure the chip added in next step.

At step three (FIG. 19.3), the cMUT 1910 and system component 1970 are placed into cavities 1981. If needed, an adhesive material may be added to glue the cMUT 1910 and the component 1970 with the substrate 1980.

At step four (FIG. 19.4), a dielectric layer 1930 is placed on the top of the cMUT 1910 and the system component 1970. Opening 1960 may be formed on the material layer 1930 to access the electrodes on the cMUTs 1910 and the system components 1970. After the step four, the process steps are the same as process steps five to eight in FIG. 18 (FIG. 18.5 to FIG. 18.8). The finished system after these steps is shown in FIG. 19.5.

At last step (FIG. 19.6), the third substrate 1980 may be optionally removed. The removed third substrate 1980 may be re-useable. The packaging is finished to obtain packaged cMUT systems 1901.

Multiple transducer systems 1801/1901 can be batch-fabricated in the same process run at the same time to save cost and time using the methods shown in FIG. 12-FIG. 19. The methods to place the cMUTs into the third substrate (the packaging support substrate) shown in FIGS. 14-17 can be used to place both the cMUTs 1810/1910 and the system components 1870/1970 into the packaging support substrate before introducing the packaging substrate in FIGS. 18-19.

Figure 20:
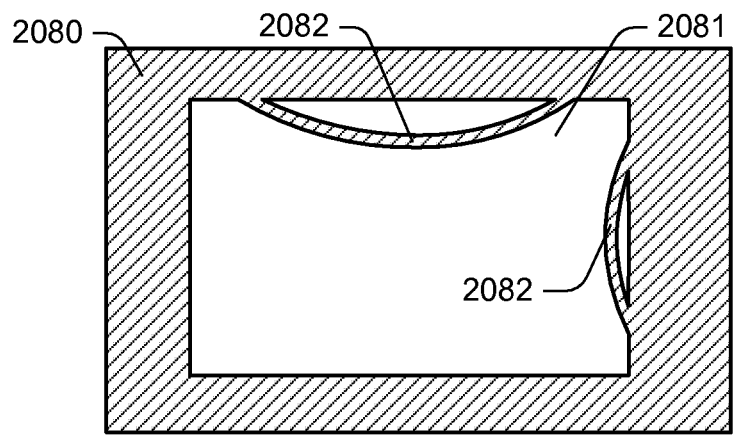
FIG. 20 illustrates a first exemplary retaining member for securing cMUT and system components.

FIG. 20 illustrates a first exemplary retaining member for securing cMUT and system components. Latch features 2082 are formed in cavity 2081 in substrate 2080. The latch features 2082 can be used as the retaining member for securing cMUT and system components (e.g., 1982 in FIGS. 19) in the cavity 2081 in the third substrate 2080. Latch features 2082 may be spring-like structures compressible toward the walls of the cavity 2081. These structures may be used separately or together.

Figure 21:
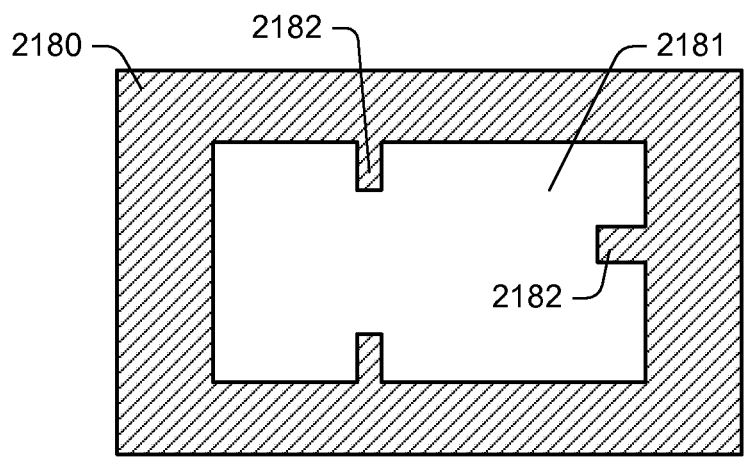
FIG. 21 illustrates a second exemplary retaining member for securing cMUT and system components.

FIG. 21 illustrates a second exemplary retaining member for securing cMUT and system components. Latch features 2182 are formed in cavity 2181 in substrate 2180. Latch features 2182 may be structures positioned on the walls of the cavity 2181. These structures may be used separately or together.

Using the disclosed package method, any number of transducers or transducer arrays and any combination of transducer and auxiliary system components can be packaged. Multiple transducer systems can be packaged together in the same batch run and separated after packaging. Each packaged transducer system may have any combination of transducer(s) and auxiliary system component(s), depending on the system design.

Figure 22A:
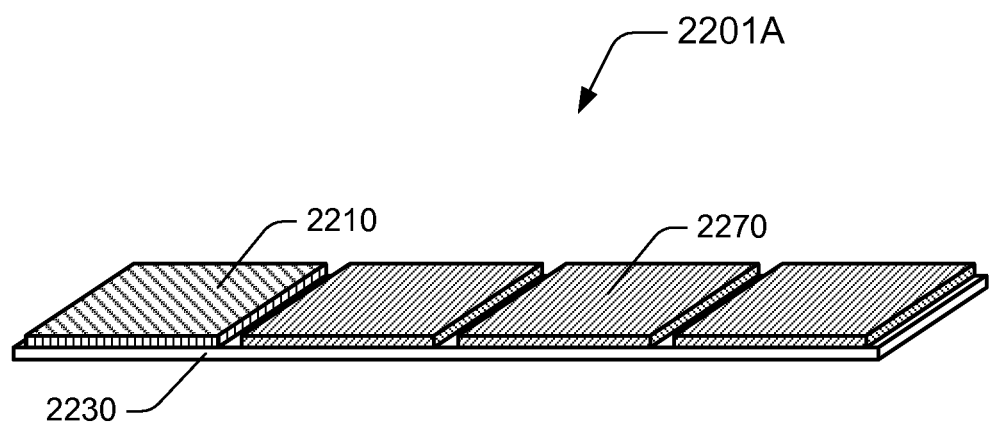
FIGS. 22A and 22B illustrate an exemplary packaged transducer system.
Figure 22B:
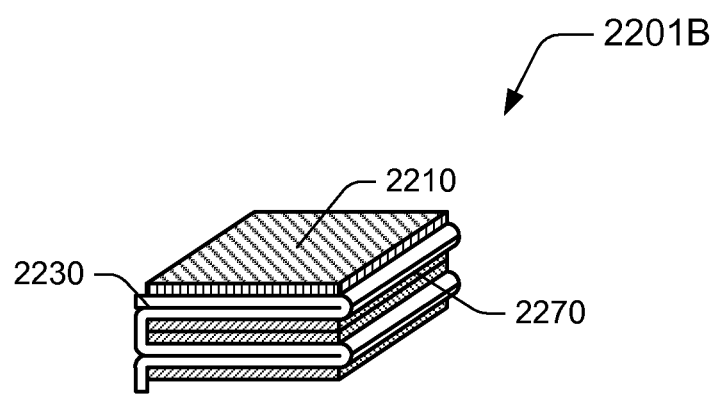

FIGS. 22A and 22B illustrate an exemplary packaged transducer system. They packaged transducer system 2201A has a transducer 2210 and three auxiliary system components 2270 packaged together on a packaging substrate 2230 as a single system. The transducer 2210 may be a cMUT array. Each auxiliary system component 2270 may have electrical devices such as IC chips. The system 2201A may be packaged separately, or packaged together with multiple other systems (either similar or dissimilar) in the same batch run and then separated from the other systems.

In one embodiment, the packaging substrate 2230 is flexible, and the transducer 2210 and the auxiliary system components 2270 can be bended or folded into a tightly packaged transducer system 2201B as shown in FIG. 22B. This implementation is important to applications such as Intravascular Ultrasound (IVUS) and Intracardiac Echocardiography (ICE) and 3-D imaging using a 2-D cMUT array. The packaging substrate 2230 can be flexible if a flexible dielectric material is used in the packaging process described herein.

Furthermore, the flexible packaging substrate may be made of two or more layers of different materials can be designed to build a desired internal stress profile (such as a bimorph structure) to control the curvature of the finished device by selecting proper materials for the different layers. The curvature of the finished device can also be controlled by temperature change if the flexible substrate is made of two or more layer of materials with different thermal expansion properties. The curvature of the finished device can also be controlled using shape memory alloys.

The process shown in present disclosure can be batch fabricated using facilities of the semiconductor process, MEMS process and PCB fabrication process. Especially, if a proper third substrate is selected as the packaging substrate, the packaging fabrication process can be carried out in a regular PCB or flexible PCB fabrication facility, dramatically decreasing the cost of the packaged transducers.

Examples of using the above-described packaging method are disclosed in the cross-referenced International (PCT) Patent Application No. PCT/US2008/085447, filed Dec. 3, 2008, entitled "CMUT PACKAGING FOR ULTRASOUND SYSTEM", and filed on even date with the present application.

It is noted that although the method is illustrated using micromachined ultrasonic transducers, especially capacitance micromachined ultrasonic transducers (cMUTs), the packaging method disclosed herein can be applied to any electrostatic transducers, and can also be used for fabricating any other transducers or sensors. Fabrication of cMUTs Suited for Packaging The packaging methods disclosed herein can be used to package a variety of cMUT arrays. The cMUTs or cMUT arrays that need to be packaged may be fabricated using any suitable fabrication method. Certain cMUTs, however, may be of special interest when it comes to packaging cMUTs using the packaging methods disclosed herein.

For example, the cMUT arrays to be packaged may need to have separate bottom electrodes for different cMUT elements. Such cMUT arrays may be fabricated using the through wafer interconnection methods disclosed in International Application (PCT) No. PCT/IB2006/051566, entitled "THROUGH WAFER INTERCONNECTION", filed on May 18, 2006; and U.S. patent application Ser. No. 11/425, 128, entitled "FLEXIBLE MICRO-ELECTRO-MECHANICAL TRANSDUCER", filed on Jun. 19, 2006, which patent applications are incorporated by reference in their entirety.

The fundamental idea of the through-wafer interconnection methods disclosed above is to etch a first pattern (e.g., trenches or openings) from the front side of the transducer (the side containing the transducers) to a desired thickness, optionally fill the first pattern with a filler material, and subsequently etch a second pattern (e.g., trenches or openings) from the back side to reach the bottom of the first pattern.

Moreover, the above describes methods, which are used to separate the bottom electrodes of the cMUTs elements in a cMUT array, can be also used to separate the cMUT arrays from their substrates. The separated cMUT arrays can then be packaged using the methods shows in FIGS. 13-17 and FIG. 19.

In some applications of a cMUT array, the thickness of the cMUT array may be desired to be thin so that the packaged cMUT arrays or systems can be packaged into a very small space required by some applications. In this case, the second etch in the through-wafer interconnection methods can simply be a thinning-down process of the wafer to reach the bottom of the first etched pattern.

Several exemplary fabrication processes to make a cMUT array with a thin substrate are described below. The described fabrication processes may be used for separating the bottom electrodes of individual cMUT elements in the same cMUT array, separating the bottom electrodes of different cMUT arrays, completely separating individual cMUT arrays from the fabrication substrate, or any combination thereof, depending on the pattern of the trenches described herein.

In most applications, multiple cMUT elements defining a cMUT array are used to perform a desired function. Usually each element in the cMUT array is addressed (i.e., connected to a signal line) from one of its two electrodes, and the other electrode is connected to a common electrode which is usually shared by multiple cMUT elements or all cMUT elements in the array. However, it is also possible that both electrodes of the cMUT elements are addressed separately. The cMUT electrode can be accessed from either the front or back side of the cMUT fabrication substrate. A through wafer interconnection feature is needed to access the cMUT from the back side of the substrate.

Figure 23:
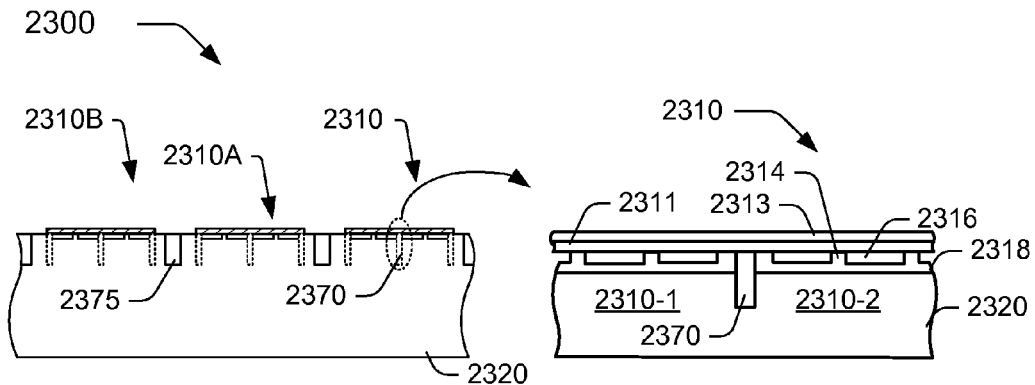
FIG. 23 illustrates a first exemplary fabrication process to make a cMUT with a thin substrate for packaging using the disclosed packaging methods.
Figure 23:
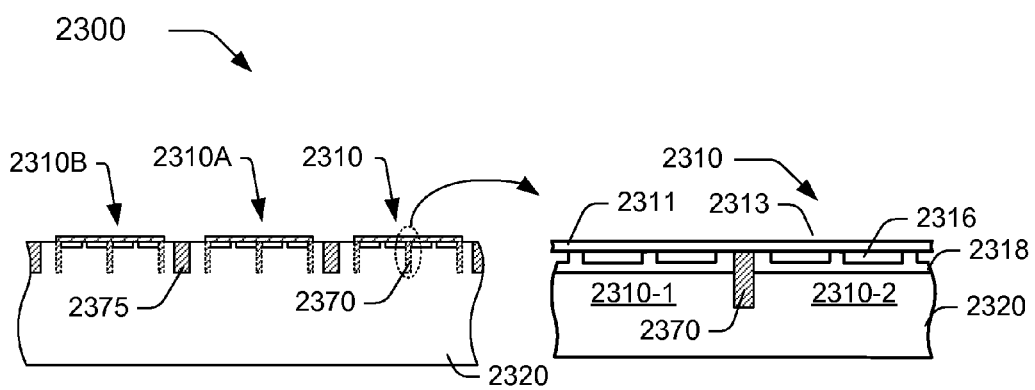
Figure 23:
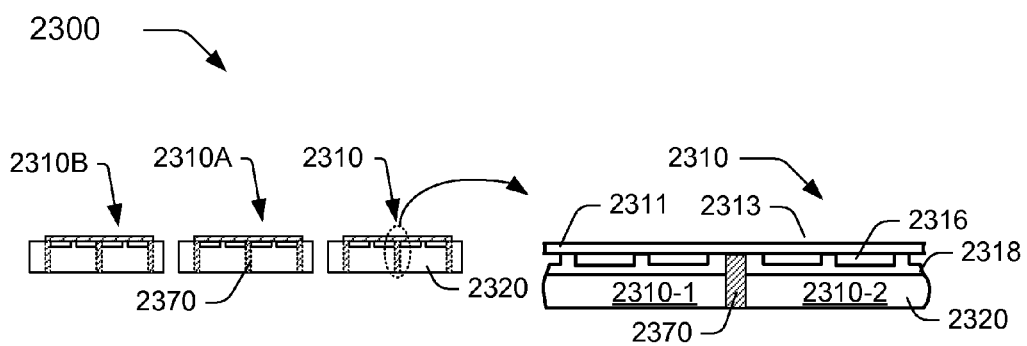

FIG. 23 shows a first exemplary fabrication process to make separated cMUT arrays with a thin substrate for packaging using the packaging techniques disclosed herein. The packaged thin cMUT arrays can be used to form a cMUT system such as shown in FIG. 22. The flexible membrane cMUT is used to demonstrate the method in FIG. 23. However, other cMUT designs, especially embedded-spring cMUTs (EScMUT), can also be fabricated or processed using the same method in FIG. 23.

For simplicity, three neighboring cMUT arrays 2310, 2310A and 2310B are shown in cross-section views. It is appreciated that actual fabrication process may involve any number of cMUT arrays built on the same substrate. It is noted that each cMUT array 2310 may have any number of cMUT elements which can be arranged either in a 1-D array or a 2-D array.

The process illustrated below is used to separate the bottom electrode of the individual cMUT arrays 2310, 2310A and 2310B. However, the same process may be used to completely separate the individual cMUT arrays 2310, 2310A and 2310B from the rest of the fabrication substrate. The separated cMUT arrays 2310, 2310A and 2310B can be subsequently assembled into third substrate serving as a packaging supposed structure. The same process may also be used to separate the bottom electrodes of individual cMUT elements 2310-1 and 2310-2 within the cMUT array 23010, 2310A and 2310B if the pattern of the trench is defined accordingly For example, in addition to the trenches (or opening patterns) 2375 that define the boundaries of individual cMUT arrays, more detailed trenches 2370 may be added to define the boundaries of cMUT elements to fabricate separate bottom electrodes for the cMUT elements.

As shown in FIG. 23, each cMUT array (2310, 2310A or 2310B) has flexible membrane 2311, top electrode 2313, cavities 2316, membrane anchors 2314, insulation layer 2318 and cMUT fabrication substrate 2320. The substrate 2320 can be made of a conductive material to serve as the bottom electrode. Figures at the left side in FIG. 23 show that the multiple cMUT arrays 2310, 2310A and 2310B are fabricated in the same substrate 2320. Figures at the right side in FIG. 23 are zoomed from a portion of the cMUT array 2310 in the left figures to show the detailed structure of the cMUT elements 2310-1 and 2310-2 in a cMUT array 2310 in the same process step as the figures at the left side.

At step one (FIG. 23.1), a first pattern (e.g., trenches or openings) 2370, 2375 is formed from a top side of the cMUT fabrication substrate 2320. The first pattern includes trenches (or openings) 2375 which may define a boundary of each cMUT array 2310, 2310A or 2310B and trenches (or openings) 2370 which may define a boundary of each cMUT element in a cMUT array 2310. The trench's deepest end reaches only a partial depth the cMUT fabrication substrate 2320. The formation of the first pattern 2370/2375 can be integrated into cMUT structure during cMUT fabrication. For example, the first pattern 2370/2375 may be formed before the cMUT structure (including the flexible membrane 2311, the top electrode 2313, membrane anchors 2314 and cavities 2316) is formed. Alternatively, the first pattern 2370/2375 can be formed after the cMUT fabrication through the top surface of the cMUT 2300.

At step two (FIG. 23.2), the first pattern may be filled with a desired material. The filling material is usually insulation material such as Parylene, polyimide, polymer, PDMS, oxide, and nitride.

At step three (FIG. 23.3), the wafer is thinned-down from the back side of the substrate 2320 to the bottom of the first pattern 2370/2375 so that the bottom electrodes of the cMUT elements 2310-1 and 2310-2 in each cMUT array are electrically separated from each other; and further the bottom electrodes in cMUT arrays 2310, 2310A and 2310B on the substrate 2320 are electrically separated between different cMUT arrays. In addition, the cMUT arrays 2310, 2310A and 2310B can be separated and detached from the substrate 2320 if trenches or openings 2750 are properly designed. The separated cMUT arrays can then be used for packaging using the packaging methods disclosed herein (e.g., FIGS. 13-17 and FIG. 19).

As illustrated above, a bottom portion of the cMUT fabrication substrate 2320 is removed from a bottom side of the cMUT 2300 so that a remaining portion of the cMUT fabrication substrate 2320 forms bottom electrodes for neighboring cMUT arrays 2310, 2310A and 2310B, as well as the bottom electrodes of the cMUT elements in each array if opening pattern 2370 is probably defined. The removal of the bottom portion of the cMUT fabrication substrate 2320 enables the process to reach the bottom of the pattern 2370/2375. In the embodiment illustrated above, this is accomplished by directly thinning down the wafer (substrate 2320). However, the same can be accomplished using a variety of other ways as described below.

Figure 24:
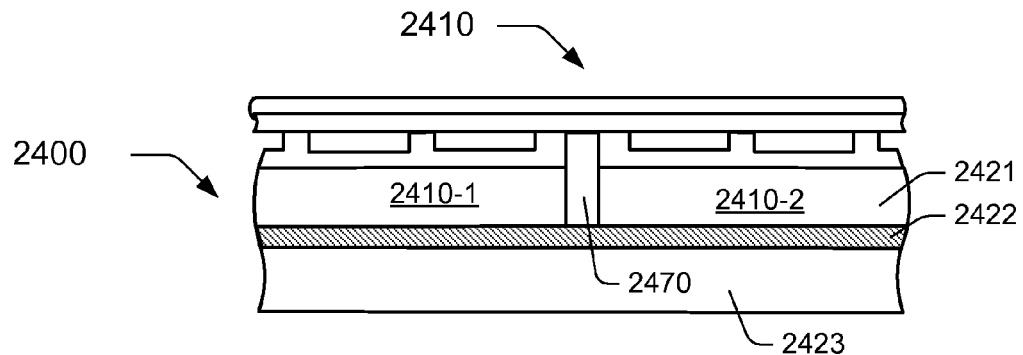
FIG. 24 illustrates a first alternative way to thin the fabrication substrate of a cMUT array.

FIG. 24 shows a first alternative way to thin the fabrication substrate of a cMUT array. The cMUT 2400 is similar to the cMUT 2300 of FIG. 23, except for a different fabrication substrate used. An SOI wafer, instead of a prime wafer, is used as the cMUT fabrication substrate for the cMUT 2400. The SOI wafer includes a device layer 2421, insulation layer 2422 and a handle wafer 2423. The first pattern (e.g., trenches or openings) 2470 is etched to reach the insulation layer 2422 of the SOI wafer. The first pattern 2470 defines the boundaries of individual transducer elements 2410-1 and 2410-2. The first pattern may also include a pattern similar to trenches or openings 2375 to define boundaries of individual transducer arrays on the same wafer. In the fabrication process, the handle wafer 2423 and insulation layer 2422 of the SOI wafer are removed to thin the substrate of the cMUT 2400 and to separate the bottom electrode of the neighboring cMUT arrays 2401 and 2402. The thickness of the cMUT 2400 is well defined by the device layer 2421 of the SOI wafer.

Figure 25:
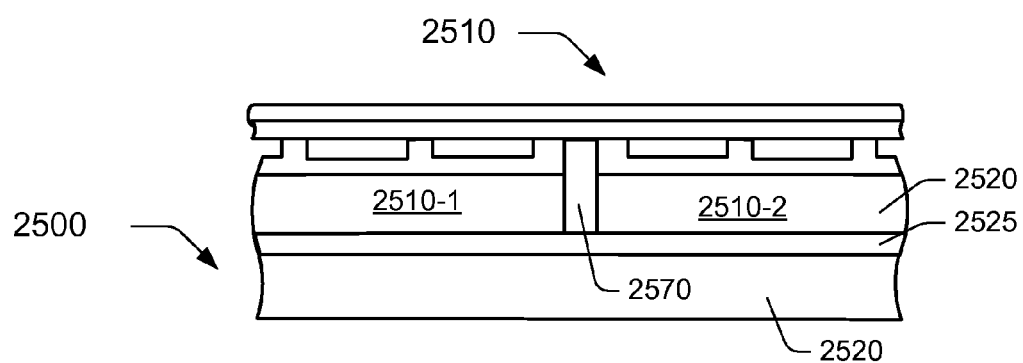
FIG. 25 illustrates a second alternative way to thin the fabrication substrate of a cMUT array.

FIG. 25 shows a second alternative way to thin the fabrication substrate of a cMUT array. The cMUT 2500 is similar to the cMUT 2300 of FIG. 23, except for a different fabrication substrate used. A wafer with embedded cavities 2525 at desired location is used to replace the prime wafer in process in FIG. 23. In this embodiment, the first pattern 2570 is etched to reach the cavities 2525. The first pattern 2570 defines the boundaries of individual transducer elements 2510-1 and 2510-2. The first pattern may also include a pattern similar to trenches or openings 2375 to define boundaries of individual transducer arrays on the same wafer. In the fabrication process, the portion of the substrate 2520 below the cavities 2525 is removed to thin the substrate of the cMUT 2500 and to separate the bottom electrode of the neighboring cMUT arrays 2501 and 2502. The thickness of the cMUT 2500 is well defined by the portion of the substrate 2520 above the cavities 2525.

In the above-described process, the first pattern 2370/2375 may be formed through the front side of the cMUT array 2300 to a desired depth after the cMUT structures have been fabricated. An insulation material may be optionally coated on the front side of the cMUT 2300 (e.g., over the electrode 2313). The trenches or openings of the first pattern 2370 may be filled with the insulation material.

Figure 26:
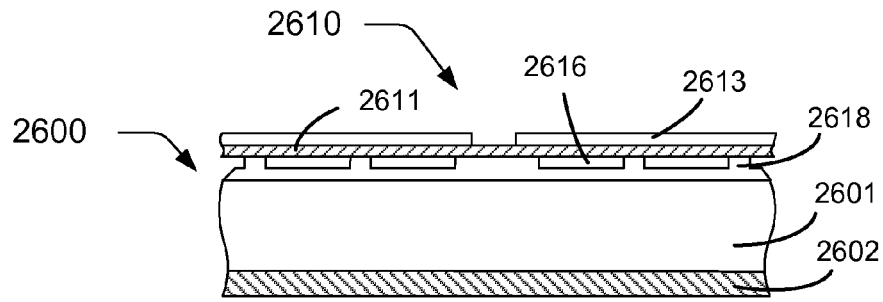
FIG. 26 illustrates a second exemplary fabrication process to make a cMUT with a thin substrate for packaging using the disclosed packaging methods.
Figure 26:
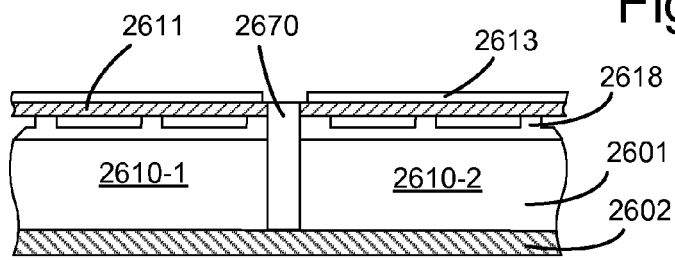
Figure 26:
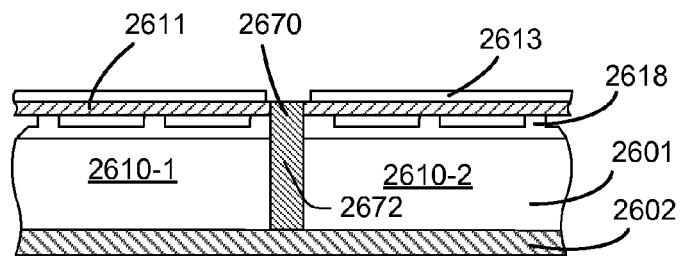
Figure 26:
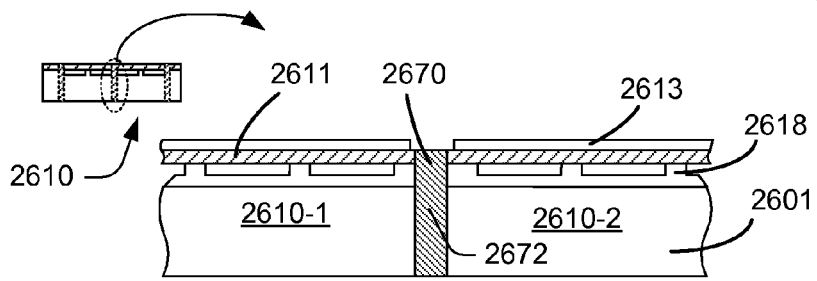

FIG. 26 shows a second exemplary fabrication process to make a cMUT with a thin substrate for packaging using the packaging techniques disclosed herein.

At step one (FIG. 26.1), cMUT 2600 is fabricated on a device layer 2601 of a SOI wafer. The thickness of the device layer 2601 defines the thickness of cMUT 2600. The flexible membrane cMUT design is used to demonstrate the method in FIG. 26. The cMUT 2600 has multiple cMUT arrays each including flexible membrane 2611, top electrode 2613, cavity 2616, and membrane anchor 2618, built on the device layer 2601 which is part of the substrate and constitutes the bottom electrode of the cMUT 2600.

At step two (FIG. 26.2), a pattern 2670 (e.g. trenches or openings) is etched through the device layer 2601 to reach to the insulation layer 2602 of the SOI wafer. The first pattern 2670 defines the boundaries of individual transducer elements 2610-1 and 2610-2. The first pattern may also include a pattern similar to trenches or openings 2375 to define boundaries of transducer arrays on the same wafer. The first pattern 2670 thus separates the cMUT elements 2610-1 and 2610-2 in the cMUT array. Alternatively, the trenches 2670 may be formed during the cMUT fabrication at step one (FIG. 26.1).

At step three (FIG. 26.3), an insulation material 2672 is optionally filled in the trench 2670, and may also be coated on the wafer and patterned.

At step four (FIG. 26.4), the handle wafer (not shown) and the insulation layer 2602 of the SOI wafer 2600 are removed to form cMUT elements 2610-1 and 2610-2 with bottom electrodes electrically separated from each other. As described in FIG. 23, the same process may be used to form cMUT arrays 2610 electrically separated from each other. This procedure may also be used to completely separate the cMUT arrays 2610 from each other so that the individual cMUT arrays 2610 may be taken off the cMUT fabrication wafer. The separated cMUT arrays 2610 may be assembled on the packaging substrate later for packaging.

In this figures, the detailed structure of only one cMUT array 2610 is shown. The configuration of multiple cMUT arrays in the substrate 2620 is similar to the left side figures in FIG. 23.

The transducer packaging methods have been described above with multiple embodiments. It is appreciated that the potential benefits and advantages discussed herein are not to be construed as a limitation or restriction to the scope of the appended claims.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:
1. A method for packaging a capacitive micromachined ultrasonic transducer (cMUT) array, the method comprising:
   fabricating the cMUT array on a cMUT fabrication substrate;
   introducing a first dielectric packaging substrate layer over the cMUT array and the cMUT fabrication substrate;

forming a first pattern in the first dielectric packaging substrate layer, the first pattern having a first opening over the cMUT array;
introducing a first conductive layer patterned over the first dielectric packaging substrate layer to provide at least a first part of an interconnection for connecting the cMUT array to outside through the first opening; and
removing a portion of the cMUT fabrication substrate.

2. The method as recited in claim 1, wherein the cMUT array has a plurality of cMUT elements, the first pattern in the first dielectric packaging substrate layer has a plurality of first openings, each over a respective one of the plurality of cMUT elements, and the first part of the interconnection provided by the first conductive layer comprises a plurality of interconnections connecting each cMUT element to the outside.

3. The method as recited in claim 1, wherein the side of the cMUT array corresponds to a top side of the cMUT fabrication substrate on which the cMUT array is fabricated.

4. The method as recited in claim 1, wherein:
the fabricating the cMUT array on the cMUT fabrication substrate comprises:
providing a cMUT fabrication substrate;
forming an opening pattern from a top side of the cMUT fabrication substrate to define a boundary of the cMUT array, wherein the opening pattern reaches only a partial depth in the cMUT fabrication substrate; and
forming the cMUT array on the top side of the cMUT fabrication substrate; and
the removing the portion of the cMUT fabrication substrate comprises removing a bottom portion of the cMUT fabrication substrate from a bottom side so that a remaining portion of the cMUT fabrication substrate forms a separate bottom electrode for the first cMUT array.

5. The method as recited in claim 4, wherein the cMUT array comprises a plurality of cMUT elements fabricated on the cMUT fabrication substrate.

6. The method as recited in claim 5, wherein the opening pattern also defines boundaries of each of the plurality of cMUT elements, and removing the bottom portion of the cMUT fabrication substrate forms a plurality of separate bottom electrode each for a respective one of the plurality of cMUT elements.

7. The method as recited in claim 4, wherein removing the bottom portion of the cMUT fabrication substrate enables complete separation of the cMUT array from rest of the cMUT fabrication substrate.

8. The method as recited in claim 4, wherein removing the bottom portion of the cMUT fabrication substrate comprises: thinning the cMUT fabrication substrate from the bottom side to reach the trench's deepest end.

9. The method as recited in claim 4, wherein the cMUT fabrication substrate is an SOI wafer comprising a device layer, an insulation layer below the device layer, and a handle layer below the insulation layer, and the opening pattern reaches the insulation layer, and wherein removing the bottom portion of the cMUT fabrication substrate comprises removing the handle layer.

10. The method as recited in claim 4, wherein the cMUT fabrication substrate comprises a device layer, an embedded cavity below the device layer, and a support layer below the embedded cavity, and the opening pattern reaches the embedded cavity, and wherein removing the bottom portion of the cMUT fabrication substrate comprises removing the support layer.

11. The method as recited in claim 4, further comprising: at least partially filling the opening pattern with a dielectric filler material.

12. The method as recited in claim 4, wherein forming the opening pattern takes place prior to forming the cMUT array.

13. The method as recited in claim 4, wherein forming the opening pattern takes place after forming the cMUT array, and forming the opening pattern further comprises cutting through a top layer of the cMUT array.

14. The method as recited in claim 1, wherein the first dielectric packaging substrate layer is flexible.

15. The method as recited in claim 1, wherein the first part of the interconnection for connecting the cMUT array to the outside comprises at least one of a connection between the cMUT array and an I/O pad, a connection between the cMUT array and another cMUT, and a connection between the cMUT array and another system component.

16. The method as recited in claim 1, wherein the first part of the interconnection for connecting the cMUT array to the outside comprises an I/O pad and at least one connection between the cMUT array and the I/O pad.

17. The method as recited in claim 1, further comprising:
introducing a second dielectric packaging substrate layer over the first dielectric packaging substrate layer and the first conductive layer;
forming a second pattern in the second dielectric packaging substrate; and
introducing a second conductive layer patterned over the second dielectric packaging substrate layer to provide at least a second part of the interconnection for connecting the cMUT array to the outside.

18. The method as recited in claim 17, wherein the second part of the interconnection for connecting the cMUT array to the outside comprises at least one of a connection between the cMUT array and an I/O pad, a connection between the cMUT array and another cMUT, a connection between the cMUT array and another system component, and a connection between the first conductive layer and the second conductive layer.

19. The method as recited in claim 17, wherein the second part of the interconnection for connecting the cMUT array to the outside comprises an I/O pad and at least one connection between the cMUT array and the I/O pad.

20. The method as recited in claim 17, wherein the second pattern in the second dielectric packaging substrate has at least a second opening over the cMUT array, and the second part of the interconnection for connecting the cMUT array to the outside includes a connection to the second opening.

21. The method as recited in claim 1, further comprising:
providing an auxiliary system component; and
placing the auxiliary system component adjacent to the cMUT array such that the first dielectric packaging substrate layer is introduced over a first side of the auxiliary system component, the first pattern in the first dielectric packaging substrate layer has at least a second opening over the auxiliary system component, and the first conductive layer is patterned over the first dielectric packaging substrate layer to provide at least part of the interconnection for connecting the cMUT array to outside through the first opening over the cMUT array and the second opening over the auxiliary system component.

22. The method as recited in claim 1, further comprising: fabricating an additional electrical component on the first conductive layer after the first conductive layer has been introduced over the first dielectric packaging substrate layer, wherein the additional electric component includes at least one of: a transmission line, a capacitor, an inductor, a pressure sensor, a switch, or an IC chip.

23. A method for packaging a capacitive micromachined ultrasonic transducer (cMUT) array, the method comprising:
   placing the cMUT array on a packaging support structure, wherein the packaging support structure includes a supporting substrate having a preformed cavity for receiving the cMUT array;
   introducing a first dielectric packaging substrate layer over the cMUT array and the supporting substrate;
   forming a first pattern in the first dielectric packaging substrate layer, the first pattern having a first opening over the cMUT array;
   introducing a first conductive layer patterned over the first packaging substrate layer to provide at least a first part of an interconnection for connecting the cMUT array to outside through the first opening; and
   removing the supporting substrate.

24. The method as recited in claim 23, wherein the cMUT array has a plurality of cMUT elements, the first pattern in the first dielectric packaging substrate layer has a plurality of first openings, each over a respective one of the plurality of cMUT elements, and the interconnection provided by the first conductive layer comprises a plurality of interconnections connecting each cMUT element to the outside.

25. The method as recited in claim 23, wherein the side of the cMUT array corresponds to a top side of a cMUT fabrication substrate on which the cMUT array is fabricated.

26. The method as recited in claim 23, wherein the first dielectric packaging substrate layer is flexible.

27. The method as recited in claim 23, wherein the cavity has a retaining member for securing the cMUT array when placed in the cavity.

28. The method as recited in claim 23, wherein the cMUT array has a through-wafer interconnection accessible from a backside of the cMUT array, and attaching the cMUT array to the cMUT array holder comprises placing the cMUT array facedown onto the cMUT array holder with the backside of the cMUT array facing toward a top side of the packaging support structure to enable access to the through-wafer interconnection from the top side of the packaging support structure.

29. The method as recited in claim 23, wherein the supporting substrate of the packaging support structure comprises a support base layer, and the cMUT array holder comprises the cavity preformed in a supplemental support layer placed over a top surface of the support base layer.

30. The method as recited in claim 23, wherein the first part of the interconnection for connecting the cMUT array to the outside comprises at least one of a connection between the cMUT array and an I/O pad, a connection between the cMUT array and another cMUT, and a connection between the cMUT array and another system component.

31. The method as recited in claim 23, wherein the first part of the interconnection for connecting the cMUT array to the outside comprises an I/O pad and at least one connection between the cMUT array and the I/O pad.

32. The method as recited in claim 23, further comprising:
   introducing a second dielectric packaging substrate layer over the first dielectric packaging substrate layer and the first conductive layer;
   forming a second pattern in the second dielectric packaging substrate; and
   introducing a second conductive layer patterned over the second dielectric packaging substrate layer to provide at least a second part of the interconnection for connecting the cMUT array to the outside.

33. The method as recited in claim 32, wherein the second part of the interconnection for connecting the cMUT array to the outside comprises at least one of a connection between the cMUT array and an I/O pad, a connection between the cMUT array and another cMUT, a connection between the cMUT array and another system component, and a connection between the first conductive layer and the second conductive layer.

34. The method as recited in claim 32, wherein the second part of the interconnection for connecting the cMUT array to the outside comprises an I/O pad and at least one connection between the cMUT array and the I/O pad.

35. The method as recited in claim 32, wherein the second pattern in the second dielectric packaging substrate has at least a second opening over the cMUT array, and the second part of the interconnection for connecting the cMUT array to the outside includes a connection to the second opening.

36. The method as recited in claim 23, further comprising:
   providing an auxiliary system component; and
   placing the auxiliary system component adjacent to the cMUT array such that the first dielectric packaging substrate layer is introduced over a first side of the auxiliary system component, the first pattern in the first dielectric packaging substrate layer has at least a second opening over the auxiliary system component, and the first conductive layer is patterned over the first dielectric packaging substrate layer to provide at least part of the interconnection for connecting the cMUT array to outside through the first opening over the cMUT array and the second opening over the auxiliary system component.

37. The method as recited in claim 23, further comprising: fabricating an additional electrical component on the first conductive layer after the first conductive layer has been introduced over the first dielectric packaging substrate layer, wherein the additional electric component includes at least one of: a transmission line, a capacitor, an inductor, a pressure sensor, a switch, or an IC chip.

* * * * *